(12) United States Patent
Shizukuishi

(10) Patent No.: US 10,468,383 B2
(45) Date of Patent: Nov. 5, 2019

(54) SEMICONDUCTOR DEVICE AND MANUFACTURING METHOD THEREOF

(71) Applicant: Makoto Shizukuishi, Sendai (JP)

(72) Inventor: Makoto Shizukuishi, Sendai (JP)

( * ) Notice: Subject to any disclaimer, the term of this patent is extended or adjusted under 35 U.S.C. 154(b) by 13 days.

(21) Appl. No.: 15/544,118

(22) PCT Filed: Jan. 15, 2016

(86) PCT No.: PCT/JP2016/051078
§ 371 (c)(1),
(2) Date: Jul. 17, 2017

(87) PCT Pub. No.: WO2016/114377
PCT Pub. Date: Jul. 21, 2016

(65) Prior Publication Data
US 2017/0373042 A1 Dec. 28, 2017

(30) Foreign Application Priority Data

Jan. 16, 2015 (JP) .................................. 2015-006782
Aug. 28, 2015 (JP) .................................. 2015-168489

(51) Int. Cl.
| | | |
|---|---|---|
| *H01L 25/065* | (2006.01) | |
| *G01T 7/00* | (2006.01)*H01L 27/14* | |
| (2006.01) | *H01L 27/144* | |
| (2006.01) | *H01L 27/146* | |
| (2006.01) | *H01L 31/08* | |
| (2006.01) | | |

(Continued)

(52) U.S. Cl.
CPC .......... *H01L 25/0657* (2013.01); *G01T 1/242* (2013.01); *G01T 7/00* (2013.01); *H01L 23/481* (2013.01); *H01L 27/14* (2013.01); *H01L 27/144* (2013.01); *H01L 27/146* (2013.01); *H01L 27/1485* (2013.01); *H01L 27/14685* (2013.01);

(Continued)

(58) Field of Classification Search
CPC .......... H01L 25/0657; H01L 27/14875; H01L 27/14685; H01L 27/14687; H01L 23/481; H01L 27/1485; H01L 27/14812; H01L 29/76891; H01L 21/30625;

(Continued)

(56) References Cited

U.S. PATENT DOCUMENTS

| | | |
|---|---|---|
| 5,337,340 A | 8/1994 | Hynecek |
| 6,423,974 B1 | 7/2002 | Ishikawa et al. |

(Continued)

FOREIGN PATENT DOCUMENTS

| | | |
|---|---|---|
| JP | S55-072346 U | 5/1980 |
| JP | S55-144576 A | 11/1980 |

(Continued)

OTHER PUBLICATIONS

International Search Report for International Application No. PCT/JP2016/051078 dated Apr. 19, 2016.

*Primary Examiner* — Cuong B Nguyen
(74) *Attorney, Agent, or Firm* — Harness, Dickey & Pierce, P.L.C.

(57) ABSTRACT

A semiconductor device includes n semiconductor chips stacked via electrical contacting means in the silicon substrate thickness direction, n being an integer larger than 2, a side face of the stacked semiconductor device in the substrate thickness direction being covered by a non-conductive layer. The shape of the side face with respect to a plan view of the stacked semiconductor device may be one of curved, convex, concave or circular.

13 Claims, 16 Drawing Sheets

(51) Int. Cl.
  *H01L 23/48*  (2006.01)
  *H01L 27/148*  (2006.01)
  *G01T 1/24*  (2006.01)
  *H01L 21/02*  (2006.01)
  *H01L 21/265*  (2006.01)
  *H01L 21/306*  (2006.01)
  *H01L 21/3065*  (2006.01)
  *H01L 29/768*  (2006.01)

(52) U.S. Cl.
  CPC .. *H01L 27/14687* (2013.01); *H01L 27/14812* (2013.01); *H01L 27/14875* (2013.01); *H01L 31/08* (2013.01); *H01L 21/02164* (2013.01); *H01L 21/02271* (2013.01); *H01L 21/265* (2013.01); *H01L 21/3065* (2013.01); *H01L 21/30625* (2013.01); *H01L 29/76891* (2013.01); *H01L 2225/06544* (2013.01)

(58) Field of Classification Search
  CPC ......... H01L 21/02271; H01L 21/02164; H01L 21/3065; H01L 2225/06544; H01L 21/265
  See application file for complete search history.

(56) References Cited

U.S. PATENT DOCUMENTS

| | | | |
|---|---|---|---|
| 2002/0109133 A1* | 8/2002 | Hikita | ..................... H01J 9/142 257/10 |
| 2003/0223531 A1 | 12/2003 | Kashima et al. | |
| 2006/0205182 A1 | 9/2006 | Soejima | |
| 2013/0256918 A1* | 10/2013 | Tomohiro | ............... H01L 25/00 257/777 |
| 2014/0240566 A1 | 8/2014 | Shizukuishi | |
| 2016/0157791 A1 | 6/2016 | Shizukuishi | |

FOREIGN PATENT DOCUMENTS

| | | |
|---|---|---|
| JP | S56-174262 U | 12/1981 |
| JP | H01-202989 A | 8/1989 |
| JP | H06-77459 A | 3/1994 |
| JP | H07-176721 A | 7/1995 |
| JP | 2000-133822 A | 5/2000 |
| JP | 2000-195825 A | 7/2000 |
| JP | 2003-139611 A | 5/2003 |
| JP | 2003-167058 A | 6/2003 |
| JP | 2005-044901 A | 2/2005 |
| JP | 2005-106644 A | 4/2005 |
| JP | 2006-253402 A | 9/2006 |
| JP | 2009-212109 A | 9/2009 |
| JP | 2010-165916 A | 7/2010 |
| JP | 2011-142330 A | 7/2011 |
| JP | 2011-205085 A | 10/2011 |
| JP | 2012-517604 A | 8/2012 |
| JP | 2013-219319 A | 10/2013 |
| JP | 2014-030170 A | 2/2014 |
| WO | WO-2010/093314 A1 | 8/2010 |

* cited by examiner

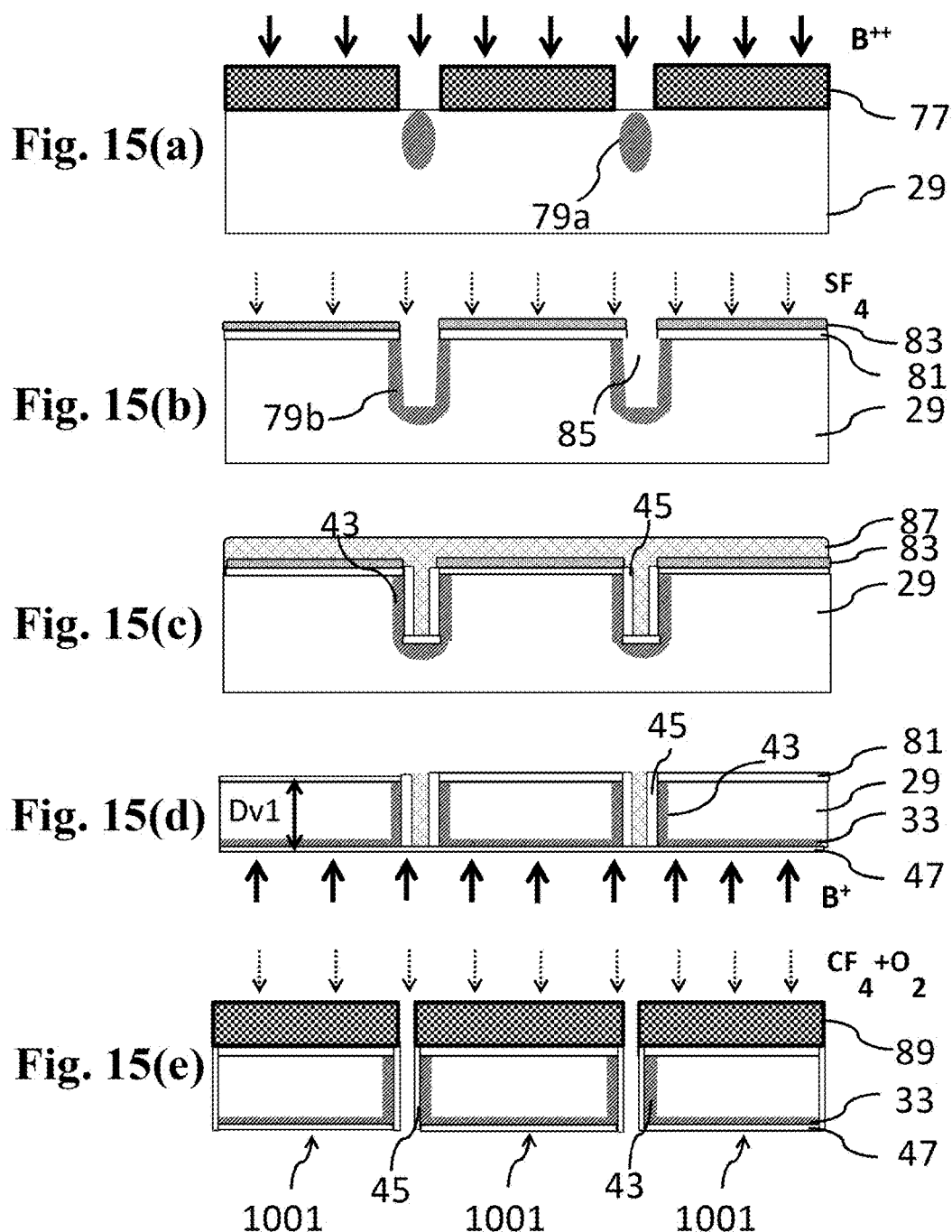

SEMICONDUCTOR DEVICE AND MANUFACTURING METHOD THEREOF

CROSS-REFERENCE TO RELATED APPLICATION

This application is a National Stage Application of PCT/JP2016/051078 filed on Jan. 15, 2016, which claims priority to Japanese Patent Application No. 2015-006782 filed on Jan. 16, 2015, in the Japanese Patent Office (JPO), and Japanese Patent Application No. 2015-168489 filed on Aug. 28, 2015, in the JPO, the entire contents of each of which are incorporated herein by reference.

BACKGROUND

1. Technical Field

Example embodiments relate to a highly integrated, high speed, low power consumption semiconductor device with a small-sized, lightweight and flexible form factor, and manufacturing methods thereof.

2. Related Art

Miniaturizations of Metal Oxide Semiconductor (MOS) elements such as a MOS transistor feature size have been main measures to increase their integration densities and their operating speeds since the early days. Miniaturizations of the MOS transistor, however, may cause less noise margin due to a lower power supply voltage required accordingly. A three dimensional (3D) stacked semiconductor device has been developed in order to increase an integration density of the semiconductor device per a mounting area or foot print on a circuit board. The stacked semiconductor device may be useful especially for layering memory chips of a same type vertically to save memory board space. However, still new technical problems and difficulties are becoming conspicuous. For example, the total number of input and output terminals increases and the chip area for input and output buffer circuits increases as well due to the increase of address and data bit lengths. For example, the effective chip area for the internal integrated circuits or memory cells may be relatively decreased by the increased area for the terminals and the buffer circuits. As for the stacked device using different types of semiconductor chips like an image sensor and image digital signal processor, for example, each location of input or output terminals, and each chip outer shape should be compatible with each other.

The patent document 1 discloses a semiconductor X-ray photo-sensor structure, which enables X-ray spectroscopic analysis by the photo-electric conversion performed during the X-ray traveling inside the semiconductor substrate in the direction parallel to the semiconductor substrate. A CT scanner using the above mentioned type X-ray photo-sensor is shown in the patent document 2. Similarly, a semiconductor photo-sensor, which enables mainly an infrared image capturing by the photo-electric conversion performed during visible or infrared light traveling inside the semiconductor substrate in the direction parallel to the semiconductor substrate, is shown in the patent document 3. In these cases, photo-electric conversion efficiency is improved because incident light travels inside the semiconductor substrate in the direction parallel to the semiconductor substrate. In the case of a digital still camera, for example, where visible light may be detected, the incident light irradiates the surface of the silicon substrate at right or its tilted angles. Because, the visible light may be effectively adsorbed and converted to electrical signals within 5 micron-meter in depth. In the cases of infrared and X-ray, on the other hand, dozens to several hundreds of micron meters in depth, or operating voltage of more than dozens of volts are required. These requirements are against the demands of higher circuit integration, higher driving speed and lower power consumption as mentioned above. The semiconductor photo-sensor, where light travels in the direction parallel to the semiconductor substrate, was thus proposed. It would be difficult to utilize one side of the square shaped semiconductor substrate as a light receiving face, because the semiconductor side face is mechanically and thermally damaged. The side face of the semiconductor substrate for the light receiving face being exposed to the atmosphere in the first place is just after a semiconductor wafer dicing process in the latter half of the manufacturing process (or called back end process). Accordingly, the condition of the side face of the crystalline semiconductor substrate has chippings and defects formed by the rotating blade used for the dicing process, or re-adhesion of the molten semiconductor material caused by the laser saw used for the dicing process. In these dicing processes, it would be difficult to get precise side face finishing because of the significant amount of the substrate material that is lost during the dicing process. Moreover, the light receiving face formed by these dicing processes would be directly exposed to the atmosphere in operating condition, and as a result, captured image quality, product reliability, and product life time of the semiconductor imaging device would be degraded.

PATENT DOCUMENTS

1. JP S55-144576
2. JP 2012-517604
3. JP 2011-205085

SUMMARY

According to at least on example embodiment, a stacked semiconductor device includes n semiconductor chips stacked via electrical contacting means in the silicon substrate thickness direction, n being an integer larger than 2, a side face of the stacked semiconductor device in the substrate thickness direction being covered by a non-conductive layer.

The shape of the side face with respect to a plan view of the stacked semiconductor device may be one of curved, convex, concave or circular.

According to at least one example embodiment of the inventive concepts, a stacked semiconductor includes n semiconductor chips stacked via electrical contacting means in the silicon substrate thickness direction, here n is an integer larger than 2, wherein the stacked semiconductor device further includes a hollow through the first chip to the nth chip in the substrate thickness direction.

The side face of the hollow may be covered by a non-conductive layer.

The stacked semiconductor device may further include a metal layer formed between the semiconductor chips or on the side face of the hollow.

The stacked semiconductor device may further include light receiving windows on the side face of one or more than two of the semiconductor chips, and wherein a photo-electric conversion region is formed radially with respect to a plan view of the stacked semiconductor device, and in the direction parallel to a silicon substrate surface on which integrated circuits are formed.

An array pitch between the light receiving windows along the side face may be larger than the thickness of the semiconductor substrate.

According to at least one example embodiment of the inventive concepts, a method of manufacturing a semiconductor chip includes a process step exposing a part or entire side face in the direction of Z-axis of each semiconductor chip formed on a wafer.

The method may further include individualizing the semiconductor chips while maintaining the side faces by dicing the wafer along the scribe lines.

According to at least one example embodiment, a method of manufacturing a semiconductor chip includes forming non-conductive layers on side faces of semiconductor chips on a wafer in the direction of Z-axis; and individualizing the semiconductor chips by etching the non-conductive layers.

The method may further include implanting impurity ions into the regions of side faces of the semiconductor chips formed on a wafer; trench-etching the region implanted partially; forming silicon dioxide layers on the side wall of the trenches; forming CVD silicon dioxide plugs in the trenches; flattening the surfaces of the plugged silicon dioxide; thinning the backside of the wafer by polishing; and exposing the side faces by etching the plugged silicon dioxide partially.

The method may further include implanting highly concentrated impurity ions into the regions of side faces of the semiconductor chips formed on a wafer; thinning the backside of the wafer by polishing; and etching the implanted regions on the wafer by a reactive ion etcher (RIE) while forming non-conductive and protective layers on the side faces of the semiconductor chips.

Problems

The total number of input and output terminals called contact pads being located on the periphery of the semiconductor chip may increase with increasing densities of integrated circuits or memory cells. It may be difficult to reduce the area for these contact pads accordingly unlike the miniaturization of a MOS transistor feature size. The semiconductor substrate below the contact pads cannot be utilized for MOS transistors, and the chip size may be determined not by an area for circuits or memory cells to be formed on the chip, but the total number of the contact pads and their arrangement. An image sensor used in a medical endoscope, where the chip size should be as small as possible, would be one of such a typical and difficult case. In recent years, micro-pads and micro-bumps, and through silicon via (TSV) technologies are introduced instead of the conventional wire-bonding technology, which may reduce the area where input and output terminals are formed. The area occupied by these input and output terminals may increase even more with increasing the number of input and output terminals for wider address and data bits. Consequently, the above mentioned difficulty has not been resolved yet. In addition to reducing the area for the input and output pads, regions near the chip periphery conventionally called scribe or dicing margin-should be also utilized as an active region. Semiconductor chips are formed by dicing a semiconductor wafer separating into plural dies. Side faces and periphery of the semiconductor chip have a lot of crystal defects caused by such a mechanical and/or thermal stress during the dicing process, and may be exposed to environmental metal impurities or reactive chemicals, for example. In a conventional case, contact pads are located around the chip periphery, which may separate a circuit or a memory array away from the rough side edges, and the chip after dicing is packaged by a resin molding or in a ceramic case to protect the chip against surrounding contaminations, and consequently, above mentioned reliability problems due to the crystal defects or operating environmental conditions could be effectively prohibited. Such un-used regions near the chip periphery should be utilized in order to place integrated circuits or memory cells even closer to the chip periphery. By utilizing most of the regions near the chip periphery or the chip side face effectively, circuit or memory densities on the chip may be increased significantly, and a semiconductor image sensor having optical windows along the chip side face may be realized. As is discussed in greater detail below, effective utilization of the regions near the chip periphery or the chip side face enables not only increasing density of integrated circuits or memory cells but also resolving technical problems arising from various semiconductor devices now and in future.

Conventionally, semiconductor chips and other electric-components or parts are mounted on print-circuit boards being installed inside a personal computer or other electric apparatus. Semiconductor chips, however, may be used outside or be exposed to various environmental conditions. Further, a semiconductor image sensor would be used close to, or directly contact with, the photographed subject, and may even be inserted inside the subject with a suitable chip size or shape, which enables proper image capturing and signal processing. Using conventional rectangular shaped semiconductor chips for these purposes, however, it would become difficult to make smaller sized and lighter-weighted apparatuses; otherwise, usage of such a semiconductor chip may be restricted within limited environmental conditions. Conventional semiconductor chip structures and their manufacturing methods, which will reduce such a chip shape restriction without deteriorating the chip performance and reliability, have not been realized yet. In the future, demand of the semiconductor chip for small electric devices or so-called wearable terminals which people may carry on or in proximity to their bodies, will be drastically increased. Similarly, demand for the semiconductor chip which may be embedded in an eyeball, a blood vessel, or other organs, for example, will be also drastically increased. In these applications, it would be an important technical issue whether or not we can use a semiconductor chip with a suitable shape and size that is easy to introduce inside a living body, in addition to the other requirements like higher circuit integration, smaller chip size and lower power consumption, for example. In a case of a watch-shaped wearable terminal, a non-rectangular shaped semiconductor chip, for example, may be successfully assembled inside the circular shaped terminal housing with a minimum space loss. Further, if the side face of the semiconductor chip is sufficiently flat and has a lower crystal defect density, and may prevent the chip from impurity contaminations, logic and memory cells, for example, may be placed on the semiconductor surface closer to the chip periphery. As for a stacked semiconductor device, a semiconductor sensor chip stacked on a different semiconductor chip including digital image processing circuits, for example, each chip should have the same chip size and outer shape because in order to dice the stacked wafers all together to get each separated stacked semiconductor device. In addition, the layout of each input and output terminals on each chip should coincide with that of the neighboring chip between the stacked chips.

As mentioned above, problems to be solved include providing a semiconductor chip structure which may significantly increase a density of integrated circuits or a memory cells with lower operating voltages and lower power consumptions, and to provide a semiconductor chip external form suitable for various applications and environmental conditions. Another problem to be solved is to provide a semiconductor structure which may improve the semiconductor chip reliabilities against environmental conditions, and to prevent noise generation, reliability or product lifetime degradation arising from interface states, lattice defects, or contaminations of heavy metal impurities and reactive chemicals, especially when the chip peripheral regions or the chip side face are utilized.

Yet another problem to be solved is to provide a semiconductor sensor structure capable of infrared and X-ray detection with a lower operating voltage and lower power consumption, and to provide a semiconductor chip structure having improved environmental stabilities against changes of temperature and humidity, or mechanical vibrations, for example. Further, one problem to be solved is to provide a semiconductor sensor structure applicable to various sizes and shapes of human bodies and internal organs, especially when using the sensor in proximity to, directly in contact with, or while inserted inside the photographed object. Further, one problem to be solved is to provide a semiconductor sensor structure suitable for a large imaging system like a CT (computer tomography) scanner, for example, where higher image signal processing should be achieved. The image capturing surface of the semiconductor sensor should be isotropic against the incident light beam or photographed object. Signal cross-talk between the neighboring pixels should be minimized to improve the quality of the reproduced image, or a higher sensitivity semiconductor sensor should be realized to capture an image under even lower light intensity or exposure. Moreover, semiconductor chip degradation due to the radiation damage should be minimized or prevented in order to bring better product reliability and lifetime. Further, noises or image defects arising from various surface states or lattice defects localized around the chip periphery should be successfully reduced or prevented. Another problem to be solved is to provide a semiconductor structure which protects a semiconductor chip from contaminations such as heavy metal ions and reactive chemicals. Yet another problem to be solved is to provide a semiconductor sensor structure which enables a larger imaging area and increasing of the total number of pixels, or higher image resolution.

The problems to be solved mentioned above are also pointed out in a case of stacked semiconductor devices because of the requirements of further device miniaturization or reduction of the device footprint. As for the stacked semiconductor device, however, there are other problems to be solved including providing a stacked semiconductor structure, which may keep the device temperature lower against the heat generation inside the device. The rise in the device temperature will limit the switching speed of the logic circuits, or increase a dark current and degrade photosensitivity of the stacked semiconductor image sensor. If the rise in the device temperature could be kept lower, a metallic heat-sink or a cooling fan could be made smaller, or became even unnecessary, and as a result, system miniaturization could be realized.

Yet another problem to be solved is to provide semiconductor manufacturing methods, which enable reduction of noises and image defects arising from various surface states and lattice defects localized around the chip periphery and side face, easier formation of curved or predetermined chip outer shape, protection against contaminations such as heavy metal ions and reactive chemicals around the device periphery or its side face, and stacking plural semiconductor chips utilizing the chip periphery or the chip side face.

Solutions

At least one side face of a stacked semiconductor device is covered by an insulating layer and the rest of side faces are exposed to the outside or are bare. The side face of the stacked semiconductor device covered by the insulating layer is curved from a plan viewpoint of the semiconductor surface where integrated circuits are formed. The outer shape of the side face in the stacked semiconductor device may be smoothly continued, preferably a circle, from a plan viewpoint, and the side face is covered by an insulating layer. Further, the stacked semiconductor device has a hollow, where semiconductor materials are partially removed through the substrates, that is located inside the stacked semiconductor device. Preferably, the side face of the inside hollow may be curved in shape from a plan viewpoint and covered by an insulating layer. In addition, the outer shape of the above stacked semiconductor device is a curved closed figure from a plan viewpoint. A higher impurity concentration region is formed under the insulating layer which covers the side face of the stacked semiconductor device. Moreover, a metal layer is formed between the front and the back surface of the stacked semiconductor device, or between the semiconductor chips. The inside wall of the hollow is covered by a sidewall metal layer, which is partially in contact with the above mentioned metal layer each other. Preferably, the semiconductor substrate is a silicon substrate and the insulator layer is a silicon dioxide film.

At least one outer side face or the side face of the hollow, preferably being covered by the insulating layer, may function as a light receiving face. In addition, a photo-electric conversion region extends from the light receiving face inward and parallel to the semiconductor substrate. Preferably, the photo-electric conversion region is formed perpendicular to the curved light receiving surface, or formed radially in the direction of the incident light beam. Further, the pixel pitch between the adjacent pixels along the side face may be close to or alternatively the same as the pixel pitch between the adjacent pixels along the stacked semiconductor chips in the vertical direction to the semiconductor substrate. Preferably, charge multiplication transfer gates are formed circularly along the photo-electric conversion region.

A semiconductor chip manufacturing process includes a wafer processing step of forming a side face of the semiconductor chip, which bares one side face of the chip vertically all the way through the semiconductor substrate. After the above mentioned side face formation, each chip is separated by wafer dicing process without cutting off the bared side face. Or, semiconductor chips formed on a semiconductor wafer are separated by an etching process which etches an insulator region around each chip. A semiconductor chip manufacturing process disclosed in an example embodiment includes wafer processing steps: impurity ion implantation into the side-wall region of each chips on wafer, partially etching the impurity doped region to form trenches, forming a silicon dioxide layer inside each trench side walls, refilling each trenches with Chemical Vapor Deposition (CVD) silicon dioxide, flattening the top surface of the refilled CVD silicon dioxide, thinning the backside of the wafer by polishing, and exposing the sidewall of each chips by etching the refiled CVD silicon dioxide region. Yet, another semiconductor chip manufacturing process disclosed in an example embodiment includes wafer processing steps: impurity ion implantation into the region near the side face of each chips on wafer, thinning the backside of the wafer by polishing, and etching the impurity doped region by a reactive ion etcher while forming a non-conductive deposited layer to protect the side face of the inside trench against the reactive ion etching. A semiconductor manufacturing process disclosed in an example embodiment includes wafer processing steps: stacking the wafers after the side face exposing process, and dicing the stacked wafers to separate each of the stacked semiconductor devices.

Advantageous Effects According to the Example Embodiments

Even in the case of stacking different type of semiconductor chips, it becomes easier to process and form each of the chips to have the same outer shape. A stacked semiconductor device using the same size chips enables even higher memory capacity or density of integrated circuits than the same size conventional stacked semiconductor device. Further, weight of the semiconductor chip or stacked device may be reduced in addition to the higher integration density, lower power consumptions, and lower heat generations, which will contribute to even longer duration of flight or even more carrying capacity of a smaller aircraft like a drone, for example.

A stacked semiconductor device, which has a curved outer shape, may be used under various mounting and environmental conditions, and enables the apparatus to be smaller and lighter. The semiconductor chip having a convex side face can be installed inside a smaller imaging system, for example. The semiconductor chip having a concave side face, on the other hand, may easily surround a photographed object, which may be used in dental or brain imaging systems, for example. Further, a stacked semiconductor device has a hollow which is located inside the semiconductor chips forming an opening from the top through the bottom chips. In addition, the inside of the hollow is covered by the side-wall metal layer, and preferably, the metal layer contacts other metal layers formed between the stacked semiconductor chips. With such a configuration, the heat generated in the stacked semiconductor device is effectively radiated toward outside, and as a result, it becomes easy to stack or insert semiconductor chips like CPU and other chips integrating higher drivability buffer circuits; where a heat sink and a cooling-fan may become smaller, or alternatively be removed.

Characteristic degradation such as noise and defective pixels caused by semiconductor surface states or crystal lattice defects may be reduced even when transistors or photo-electric conversion regions are formed near the chip periphery. A non-conductive layer formed on the chip side face may prevent the chip from contamination of metal ions or chemicals, and may extend the chip life cycle.

The light traveling distance, from the light receiving face through the photo-electric conversion region, may be set or designed to be between several micron meters and several millimeters long; where higher infrared or X-ray sensitivity can be realized. Moreover, the semiconductor imaging device with a curved light receiving face may be useful for taking optical signals from objects having a non-planer surface, or various sizes and shapes.

A highly doped impurity region formed near the chip side face under the non-conductive layer may reduce noises and pixel defects caused by surface states or crystal lattice defects.

The array pitch between adjacent pixels may not be smaller than the semiconductor substrate thickness of each sensor chip stacked; where pixels are regularly and isotopically arrayed in vertical and horizontal directions, an image sensor with a higher spatial resolution can be realized. Preferably, one or more circular shape charge multiplication transfer gates may be formed near the photo-electric conversion region, which may result in an image sensor with a higher sensitivity.

A manufacturing method of the semiconductor chip utilizing its side face, which includes process steps of exposing a part of the side face and covering it with a non-conductive material, may enable an easier chip manufacturing process. Further, after the above mentioned exposing process, semiconductor chips formed on a wafer may be divided such that each divided part keeps the side face. A manufacturing method, which includes process steps of forming a non-conductive layer on the side face of the semiconductor chip, and dividing the semiconductor wafer into chips by etching, may prevent various malfunctions caused by the wafer dicing process, which are usually observed around the periphery or the side face of the chip. A manufacturing method, which includes process steps of forming trenches at the position of side face on the semiconductor wafer, forming a silicon dioxide layer on the inside wall of each trench, refilling each trench with silicon dioxide by a CVD technique, and etching the refilled CVD silicon dioxide in part in order to form the exposed side face, may realize the side face covered by the non-conductive material with a high finishing accuracy. A manufacturing method, which includes process steps of forming a highly doped impurity region on the side face of the semiconductor chip, thinning the backside of the semiconductor wafer by polishing, while forming a deposited non-conductive layer to protect the side face of the chip during the removal of the impurity region by a reactive-ion etching, may enable higher etching speed for even a thicker semiconductor wafer, and simultaneously forming of a non-conductive layer on the side face of the semiconductor chip. According to example embodiments, in comparison with the dicing process by the conventional rotating blade or laser saw, the semiconductor chip, having a curved cutting side edge with a high finishing accuracy and limited chip damage, may be easily manufactured.

BRIEF DESCRIPTION OF THE DRAWINGS

FIG. 5(a) is a diagram illustrating a perspective view of the stacked semiconductor device 400a.

FIG. 5(b) is a diagram illustrating a plan view of the semiconductor module 400b employing four of the semiconductor module 400a.

FIG. 5(c) is a diagram illustrating a plan view of the semiconductor chip 402 used in the stacked semiconductor device 400a.

FIG. 5(d) is a diagram illustrating a plan view of the semiconductor chip 403 used in the stacked semiconductor device 400a.

FIGS. 15(a) to 15 (e) are cross sectional views that schematically outline a method for manufacturing process according to at least one example embodiment.

DETAILED DESCRIPTION

Figure 1A:
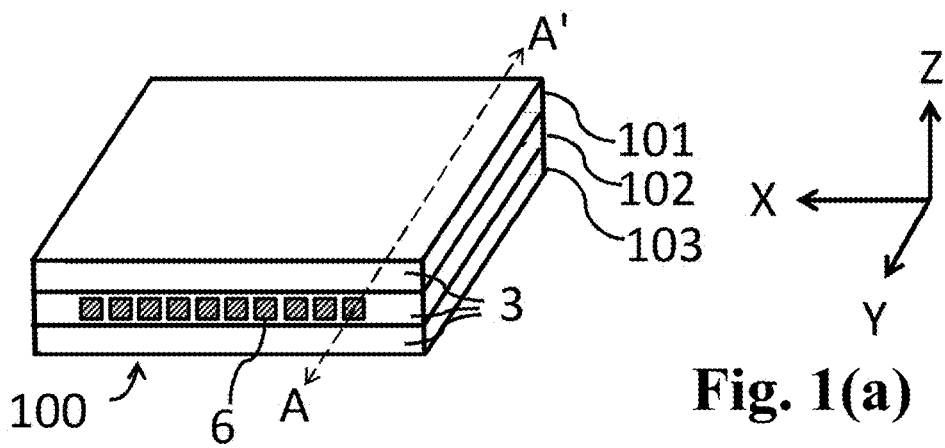
FIG. 1(a) is a diagram illustrating a perspective view of the stacked semiconductor device 100.
Figure 1B:
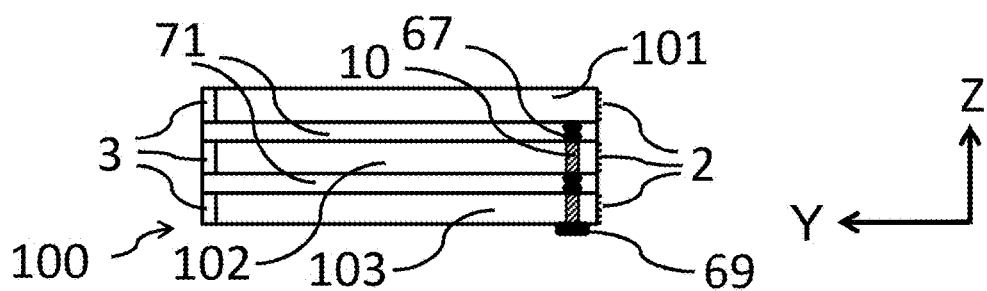
FIG. 1(b) is a diagram illustrating a cross sectional view taken along a dotted line A-A' of the stacked semiconductor device 100 shown in FIG. 1(a).
Figure 1C:
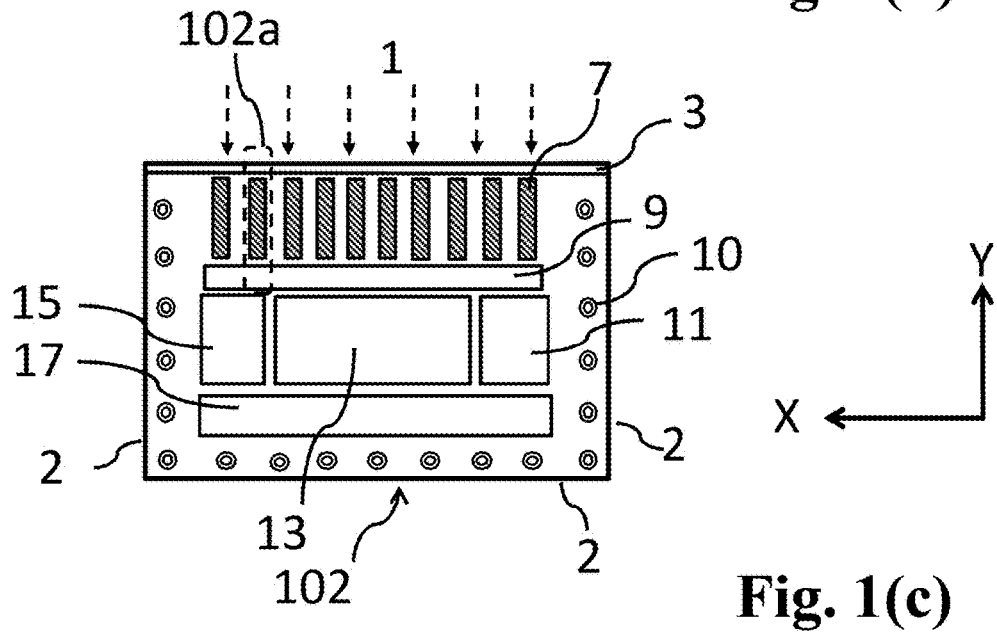
FIG. 1(c) is a diagram illustrating a plan view of the semiconductor chip 102 used in the stacked semiconductor device 100.

FIG. 1(a) shows a diagram illustrating a perspective view of the stacked semiconductor device 100. Each semiconductor chip 101, 102, and 103 are stacked successively in the semiconductor thickness direction, where electrical contacting means are put between the semiconductor chips. As shown on the right side of the figure, defining the semiconductor surface as X-Y plane, the semiconductor substrate thickness direction is defined as Z-axis. Each semiconductor chip 101, 102, and 103 shown in the FIG. 1(a) may have the same shape (a four-sided figure) from the X-Y plane view. As is discussed in greater detail below, the side face of the stacked semiconductor device 100 drawn in front of the figure, that is, each side face of the semiconductor chips 101, 102, and 103, which is parallel to the X-Z plane and is along one of the stacked semiconductor device's side faces, is covered by a non-conductive layer like silicon dioxide film 3. The semiconductor chip 102 sandwiched between the semiconductor chips 101 and 103 may be a semiconductor image sensor, for example, where plural optical windows 6 are formed on the above mentioned side face. The optical window 6 is also called a pixel or unit photo-cell idiomatically, which may indicate each end of photo-electric conversion region as explained in detail below. The semiconductor chip 101 may have various circuits to drive and control the semiconductor chip 102, a digital signal processor, and non-volatile memory, for example. The semiconductor chip 103 may have a data buffer-memory, a digital signal processor, and communication interface circuits, for example. FIG. 1(b) shows a diagram illustrating a cross sectional view of the stacked semiconductor device 100, which is parallel to the Y-Z plane taken at the position indicated by dotted line A-A' as shown in FIG. 1(a). Each side face of the semiconductor chips 101, 102 and 103, which is parallel to the X-Z plane, is covered by the non-conductive layer 3, such as a silicon dioxide film, for example. With such a configuration, device reliability may not be degraded even under the condition where these side faces are directly exposed to outside environment during the device operation. In contrast, the other three side faces 2 of the semiconductor chips 101, 102 and 103 are bare of the semiconductor substrate being exposed to the outside. Micro-bumps 67 and micro-pads (not shown in the figure) as electrical contacting means are formed between the semiconductor chips 101 and 102, and 102 and 103, in order to enable electrical connections between these semiconductor chips. The through silicon via (TSV) electrodes 10 are formed in the semiconductor chips 102 and 103 enabling the electrical connections between the front-side and back-side of the semiconductor chips 102 and 103. Non-conductive adhesive layers 71 are sandwiched between the semiconductor chips 101 and 102, 102 and 103 forming a single stacked semiconductor device 100. External inputs or outputs pads 69, which can be electrically connected with other external parts, are formed on the backside of the semiconductor chip 103 or the bottom of the stacked semiconductor device 100. A circuit block diagram in the X-Y plane of the semiconductor chip 102 is shown in FIG. 1(c). One side face of the semiconductor chip 102 is covered by the non-conductive layer 3 like silicon dioxide, for example, whereas the other three side faces 2 are bare of the silicon substrate exposed to the outside. Opt-electrical conversion regions 7 like p-n junction photo-diodes, for example, are formed in the semiconductor substrate under the non-conductive layer like silicon dioxide layer 3. Incoming light 1 in the direction of Y-axis including infrared, visible or X-ray, for example, may irradiate the opt-electrical conversion regions 7 and be converted into an electrical signal. Each length of the opt-electrical conversion region 7 in the direction of the incoming light 1 may be easily extended in the range between 10 micron-meters and 5 millimeters (mm) long, for example, which may be especially suitable for the detection of infrared or X-ray. The converted electrical signals are transmitted through the signal read-out and scanning circuit 9 to the digital signal processing circuit 11. Circuit blocks such as 13, 15, and 17 are a timing pulse generator circuit, an interface circuit, and an input and output buffer circuit, respectively. The TSV electrodes 10 are located close to the three side faces 2 on the periphery of the semiconductor chip 102, whereas the TSV electrodes 10 are not located along the side face 3 covered by the non-conductive layer on the periphery of the semiconductor chip 102. With such a configuration, the opt-electrical conversion region 7 can be formed in proximity to the side face of the semiconductor chip 102 because no TSV electrode 10 is formed on the periphery of the chip close to the side face 3. In contrast, the TSV electrodes 10 are formed along the side faces 2 being bare of the semiconductor substrate, which may be similar to a conventional semiconductor chip, without causing reliability degradation out of the target specifications. The region 102a marked by the dotted line will be discussed in greater detail below.

Figure 2A:
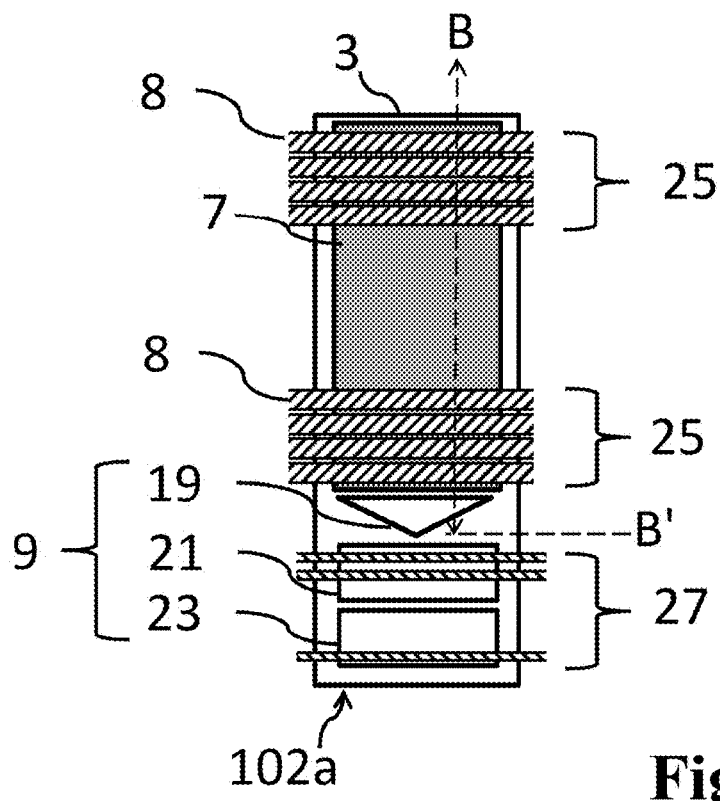
FIG. 2(a) is a diagram illustrating a detailed plan view of the portion 102a shown in FIG. 1(c).
Figure 2B:
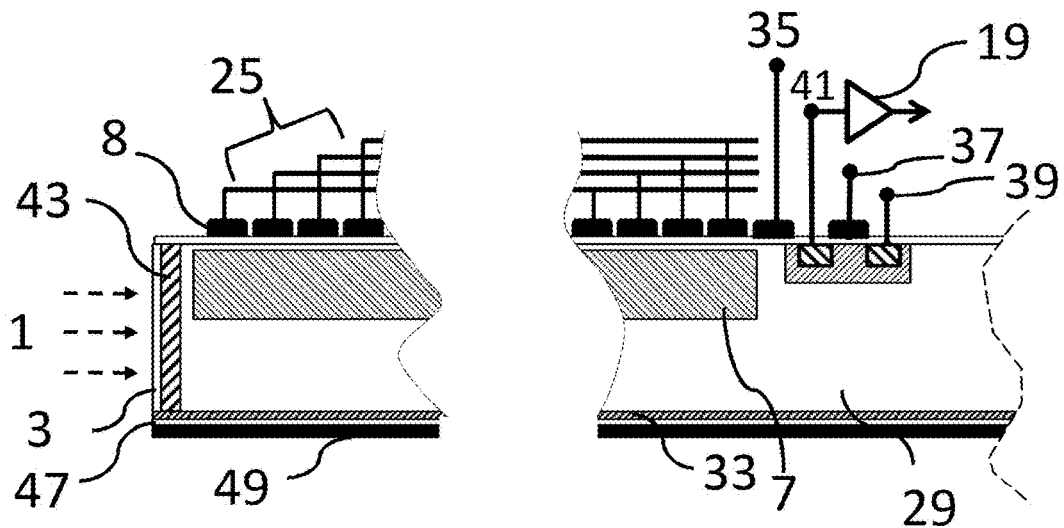
FIG. 2(b) is a diagram illustrating an equivalent circuit and a cross sectional view taken along a dotted line B-B' of the portion 102a shown in FIG. 2(a).

A detailed plan view of the portion 102a, which describes a structure of a charge coupled device (CCD) image sensor, for example, is shown in FIG. 2(a). FIG. 2(b) shows a diagram illustrating an equivalent circuit and a cross sectional view taken along a dotted line B-B' in the direction parallel to the incident light 1 as shown in FIG. 2(a). The opt-electrical conversion region 7 may also act as a charge transfer path, where a group of charge transfer electrodes 25 driven by four phases charge transfer signals are formed, for example. For the simplicity and convenience of explanation, some groups of the charge transfer electrodes 25 are removed intentionally from the FIG. 2(a) in order to show the opt-electrical conversion region 7 underneath the charge transfer electrodes 25. The transferred charges are sent to the signal read-out and scanning circuit 9. As shown in FIG. 2(a), the transferred charges are read out by the signal charge detection circuit 19 such as a floating diffusion amplifier (FDA), for example, which is formed in the signal read-out and scanning circuit 9. The read out signal is then converted into a digital signal by the analog to digital converter circuit (AD) 21, and sequentially transferred and read out by the scanning circuit 23, which are driven by the control signals provided through the wiring group 27. As shown in the cross sectional view taken along the dotted line B-B', the opt-electrical conversion region 7 is formed; where n-type impurity is doped in the p-type semiconductor substrate 29 along the direction of incident light 1, and electrically separated from the peripheral circuit blocks by a device isolation region like a highly p-type impurity doped region (not shown in the figure), for example. The opt-electrical conversion is performed by the photo-diode consisting of the p- and n-type semiconductors. The incoming light detection sequence may be started after the photodiode is fully depleted. The applied voltage, which is required for the opt-electrical conversion region 7 to be fully depleted, may be lowered because the opt-electrical conversion region 7 is formed in the direction parallel to the semiconductor substrate surface, and the groups of charge transfer electrodes 25 are laid along the distribution of the opt-electrical conversion region 7. With such a configuration, required driving voltages for the image sensor disclosed above may be lowered or equivalent with conventional two dimensional CCD area image sensors. The incident light, which does not travel through the charge transfer electrodes 25 to reach the opt-electrical conversion region, are not absorbed by the charge transfer electrodes 25. In addition, the signal charges can be also analyzed as an optical spectroscopy of incident light energy because charges stored in each packet can be read out as a function of each location along the charge transfer path. The signal charges transferred by the charge transfer electrodes 25 are moved to the floating diffusion 41 by switching on the output gate 35, and read out by the signal charge detection circuit 19. The terminals 37 and 39 are reset gate and reset drain, respectively. As explained above, the incident light may be gradually attenuated while traveling inside the semiconductor substrate. Each opt-electrical conversion region 7 extends with a length of, for example, several hundred micron meters (μm) to several millimeter (mm), enables effective photo-electrical conversion by the silicon photo-diode against X-ray beams of less than 50 kilo-electron-volts (Key). Compton scattering will take a dominant role regarding the X-ray or gamma (γ)-ray of 50 (Kev) to 5 (Mev) energy range, for example, where some of the incident X-ray or γ-ray will be converted into electron energy, and attenuated X-ray or γ-ray will interact with silicon atoms affecting their photo-electrical conversion efficiencies. Higher photo-electrical conversion efficiency is attained with increasing the thickness of the silicon substrate, or increasing the length of the opt-electrical conversion region 7 in the direction parallel to the silicon substrate surface as disclosed in this embodiment. In view of this characteristic, the signal read-out and scanning circuit 9, for example, is formed opposite side of the incident light receiving windows across the opt-electrical conversion region. With such a configuration, characteristic degradations due to the radiation damages in a MOS device may be prevented, and a semiconductor image sensor having improved product reliability and longer lifetime may be obtained.

Generally, the side faces of the semiconductor chips are first exposed to the ambient atmosphere when each chip is diced from the wafer by a dicing machine, for example. Accordingly, the condition of the side face of the crystalline silicon may be exposed to outside, and have a lot of chippings and defects caused by the dicing process. In a conventional case, bonding pads and process test patterns are located around the chip periphery, which may separate circuit blocks or memory arrays away from the diced edges of more than a hundred (100) micron meters, for example. In addition, each chip after dicing process is packaged to protect chips against surrounding atmosphere, and consequently, above mentioned characteristic degradations or contamination risks could be effectively prohibited. Moreover, no unfavorable problems are pointed out as long as the side face of the semiconductor substrate is not utilized as a light receiving face, for example. Using the side face of the semiconductor substrate as a light receiving face, however, above mentioned preconditions for the conventional case are not adapted to the example embodiment; where the light receiving face may be exposed to the direction to the photographed object and the opt-electrical conversion region is formed near by the dicing edge in order to receive the incoming light without reducing its intensity. In the example embodiment, the side face of the light receiving face may be covered by a non-conductive layer such as silicon dioxide ($SiO_2$) layer, and a highly doped p-type impurity region 43 may be formed right under the non-conductive layer. Preferably, a non-conductive layer such as a silicon dioxide ($SiO_2$) layer 47 may be formed on the backside of the semiconductor substrate, and a highly doped p-type impurity region 33 may be formed in order to minimize harmful effects due to the interface states of the backside of the semiconductor substrate. With such a configuration, noises and image quality degradations like pixel defects due to the interface states and lattice defects may be effectively prevented. In addition, the semiconductor chip may be protected from contaminations of metal ions or chemicals, and then the chip life cycle may be extended. According to the example embodiment, an optical shield layer 49 may be formed on the backside of the semiconductor substrate. Usually, aluminum thin film may be used as an optical shield against incident light, and other materials including greater atomic number or heavy metals such as Tungsten, for example, may also be useful for the optical shield especially against irregular incident X-rays. With such a configuration, semiconductor image sensor having improved image quality with less noise and cross-talk may be obtained. Using the optical shield including metal elements such as aluminum and tungsten, for example, less dark current or higher signal to noise ratio (S/N) may be also realized by the improved heat radiation effect of lowering semiconductor device temperature.

Figure 3A:
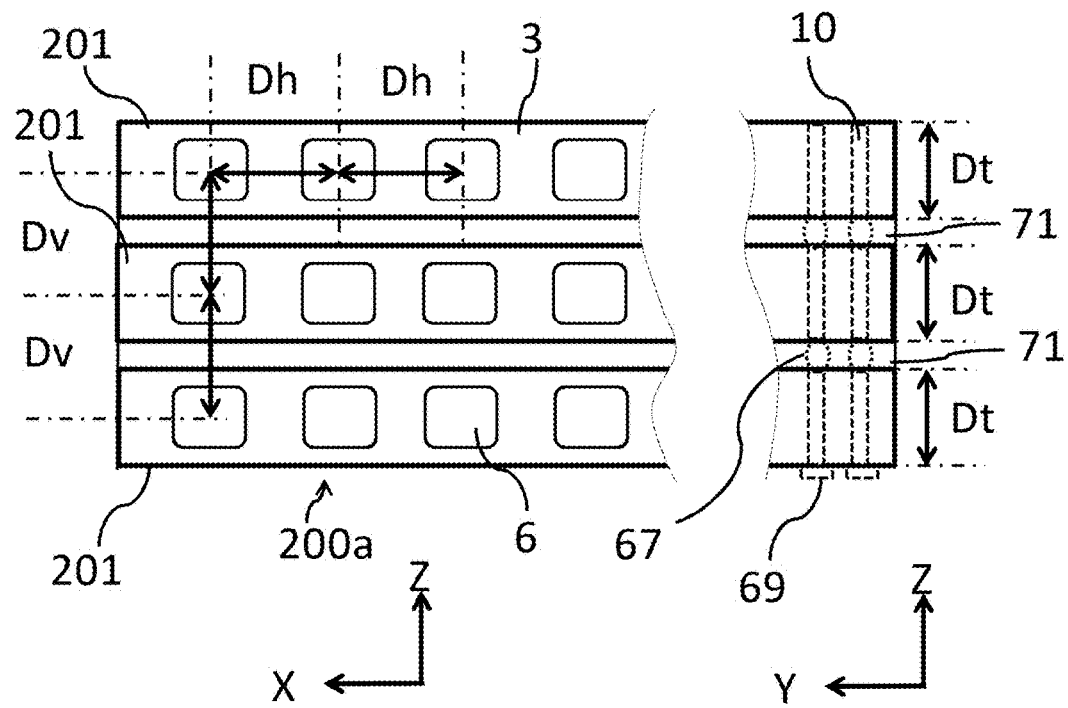
FIG. 3(a) is a diagram illustrating a plan view taken from X-Z plane and a diagram illustrating a side view of the stacked semiconductor device 200a taken from Y-Z plane.
Figure 3B:
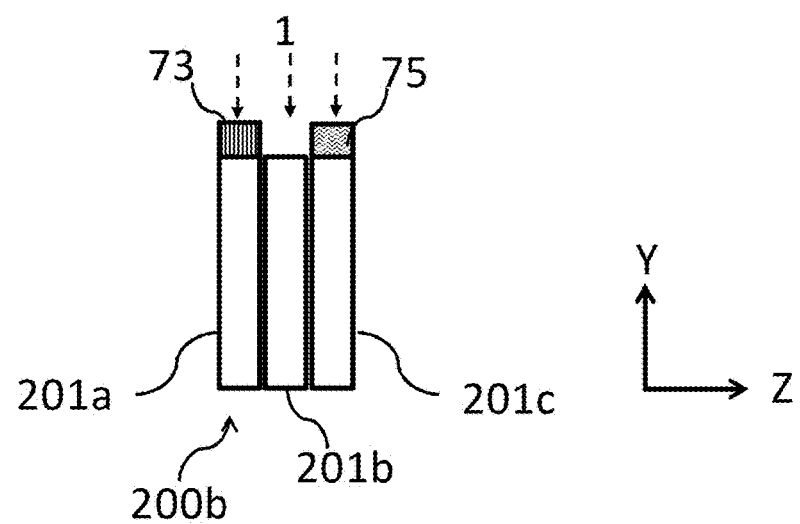
FIG. 3(b) is a diagram illustrating a side view of the stacked semiconductor device 200b taken from Y-Z plane.

According to the example embodiment, the three semiconductor chips are stacked to form the semiconductor device 100, but not limited to, four or more of semiconductor chips may be stacked. Two dimensional image capturing in X-Z plane may be realized by stacking two or more of the semiconductor image sensor chips. FIG. 3(a) shows a plan view taken from X-Z plane and a side view taken from Y-Z plane of the semiconductor device 200a where the same three semiconductor image sensor chips 201 are stacked. Plural pixels 6 are arrayed in the side face of the stacked semiconductor device 200a on the X-Z plane. It should be noted that, according to at least some example embodiments, the distances between the pixels 6 horizontally is defined as a horizontal pitch (Dh), and the distances between the pixels 6 vertically is defined as a vertical pitch (Dv). The horizontal pitch (Dh) can be accurately determined by the photo-masking step. The vertical pitch (Dv), on the other hand, may depend on the thickness (Dt) of the semiconductor chip 201 and on the thickness of the adhesive layer 71. As shown in the cross-sectional view taken from the Y-Z plane illustrated on the right hand side of the figure, each semiconductor image sensor chip 201 is electrically connected by the through silicon via (TSV) 10 and micro-bumps 67. The input and output pads 69 enable electrical contacts between the stacked semiconductor device 200a and external devices. The vertical distance Dv may be estimated in advance, and then the horizontal distance Dh may be determined during photo-mask design step accordingly. Preferably, the horizontal distance (Dh) may be larger than the thickness (Dt) of the semiconductor sensor chip 201 because the vertical pitch (Dv) may increase with thickness of the adhesive layer 71, for example. With such a configuration, each pitch in vertically and horizontally may become equal (Dh=Dv), and the image sensor device having regularly arrayed pixels, which may drastically improve image resolution with increasing the total number of pixels, may be achieved. FIG. 3(b) shows the side view of the stacked semiconductor device 200b taken from Y-Z plane according to the other modified embodiment. The semiconductor sensor chips 201a, 201b and 201c, which are made of silicon substrate, for example, may be stacked to form the semiconductor device 200b. The scintillator 73 is overlaid on the light receiving face of the semiconductor sensor chip 201a. A scintillator 73 may be inorganic materials like needle crystalline type cesium iodide (CsI), or organic materials such as anthracene or stilbene, for example. Even a transmitted X-ray through the scintillator, which did not contribute to the light emission in the scintillator, may be detected or converted into electrical signals in the semiconductor substrate, where spectral sensitivity and wavelength resolution of the incident X-ray, for example, may be significantly improved by detecting the peak light emission intensity. The semiconductor sensor chip 201b may be used for detecting visible and near infrared light, for example. A color filter 75 is overlaid on the light receiving face of the semiconductor sensor chip 201c. The wavelength of the incident light may be selectively transmitted through the color filter or cut off by the filter; where the wavelength resolution may be even more improved. Some of the incident light, which may cause image quality degradation, may be attenuated or blocked by stacking the color filter. Hybrid multi-functional diagnostic spectroscopic analyzer, for example, may be realized by stacking the semiconductor sensor chips having different optical characteristics.

Figure 4A:
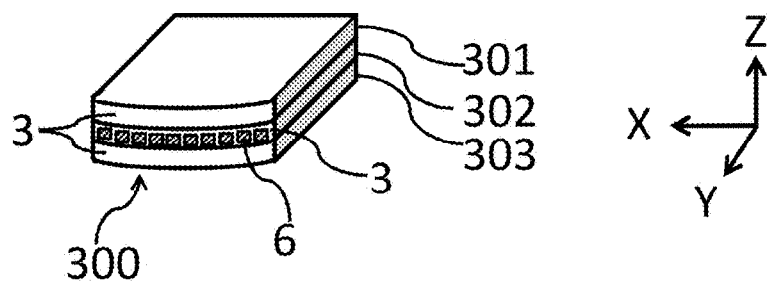
FIG. 4(a) is a diagram illustrating a perspective view of the stacked semiconductor device 300.
Figure 4B:
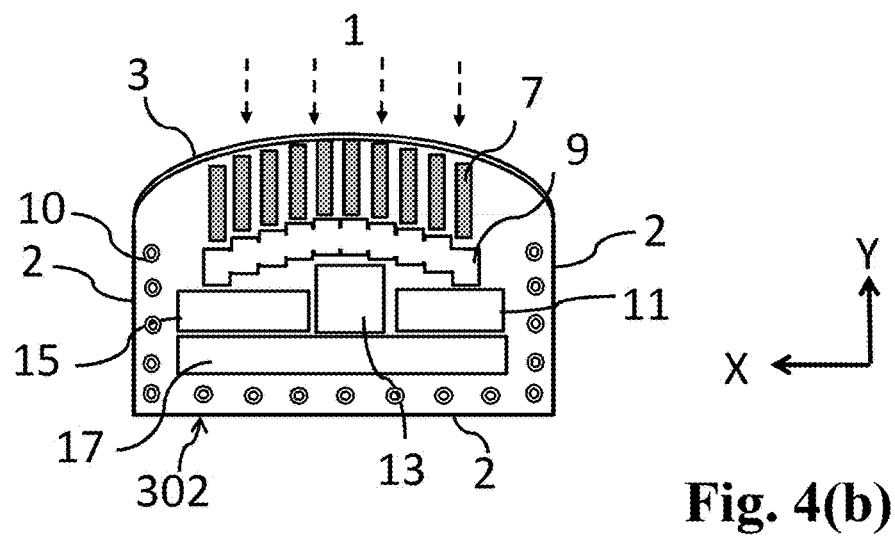
FIG. 4(b) is a diagram illustrating a plan view of the semiconductor chip 302 used in the stacked semiconductor device 300.
Figure 4C:
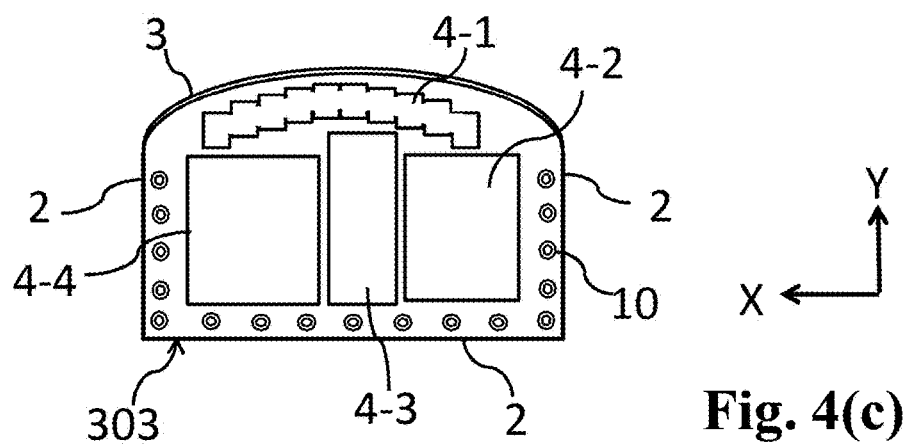
FIG. 4(c) is a diagram illustrating a plan view of the semiconductor chip 303 used in the stacked semiconductor device 300.

A perspective view of the stacked semiconductor device 300 is shown in FIG. 4(a). Each semiconductor chip 301, 302, and 303 are stacked successively in the semiconductor thickness direction, where electrical contacting means are put between the semiconductor chips. Each semiconductor chip 301, 302, and 303 shown in the FIG. 4(a) may have the same shape (one side is convex) from the X-Y plane view. As is discussed in greater detail below, the side face of the stacked semiconductor device 300 in the front in the figure, that is, the side faces of the semiconductor chips 301, 302 and 303 are covered by a non-conductive layer 3 such as silicon dioxide layers. The semiconductor chip 302 sandwiched between the semiconductor chips 301 and 303 may be a semiconductor image sensor, for example, where plural optical windows 6 are formed on the above mentioned convex side face. The semiconductor chip 301 may have various circuits to drive and control the semiconductor chip 302, a digital signal processor, and non-volatile memory, for example. The semiconductor chip 303 may have a data buffer-memory, a digital signal processor, and communication interface circuit, for example. A plan view of the semiconductor chip 302 used in the stacked semiconductor device 300 is shown in FIG. 4(b). Integrated circuit blocks 9, 11, 13, 15 and 17 may be same as those explained in the first embodiments. As shown in the figure, the light receiving face of the semiconductor substrate side face is convex in shape. The other three side faces 2, on the other hand, are bare of the silicon substrate exposed to the outside. The other structures and advantageous characteristics may be similar to those of in FIG. 1(c). The semiconductor device 300 has a convexly curved side face, which may be useful for the probe-type imaging devices that are inserted inside the body, or touch or are in close contact with the body, for example. The semiconductor device 300 may be also used to even smaller imaging system such as medical endoscope, for example. In addition, the semiconductor device 300 may be hybridized with ultra-sonographic imaging probe in order to complement ultra-sonographic images by overlaying captured infrared or X-ray images, for example. Moreover, a semiconductor device having a circular side face (not shown in the figure), which may use two or more of the semiconductor chips having convex side faces, may cover even wider or 360 degree imaging angle, for example. The structure of the semiconductor chip 303 shown in X-Y plan view of FIG. 4(c) is not rectangular but one of the sides is convex in X-Y plan view, where the curved face is covered by a non-conductive layer like silicon dioxide layer 3. Integrated circuit blocks 4-1, 4-2, 4-3 and 4-4 are formed on the semiconductor chip 303, which are above mentioned data buffer memory, digital signal processing circuit, communication interface circuit, and power supply circuit, respectively, for example. The outer shape of the semiconductor chip 303 has a curved side face like the semiconductor chips 301 and 302; accordingly it may become easier to be mounted inside a limited space or to make the same outer shape with other semiconductor chips to be stacked on.

Figure 5A:
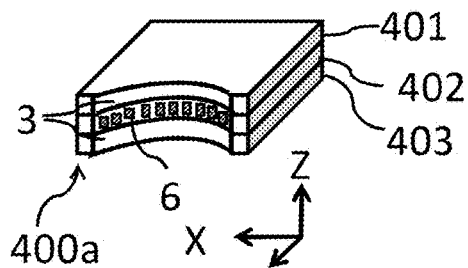
Figure 5B:
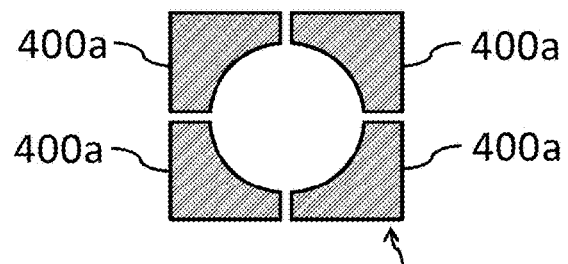
Figure 5C:
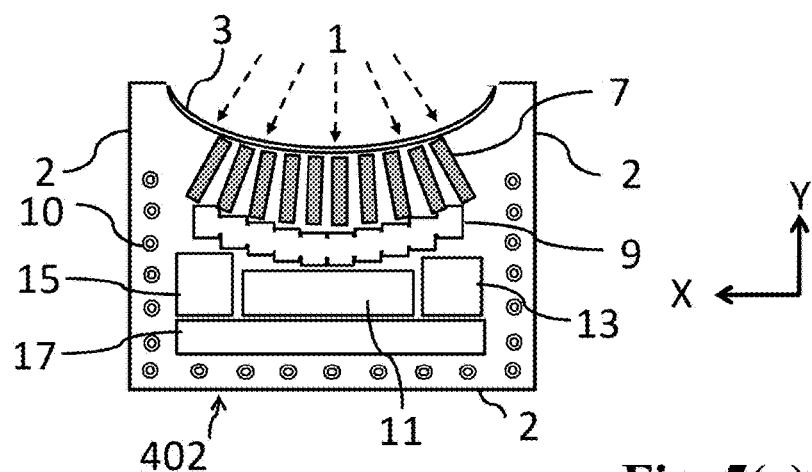
Figure 5D:
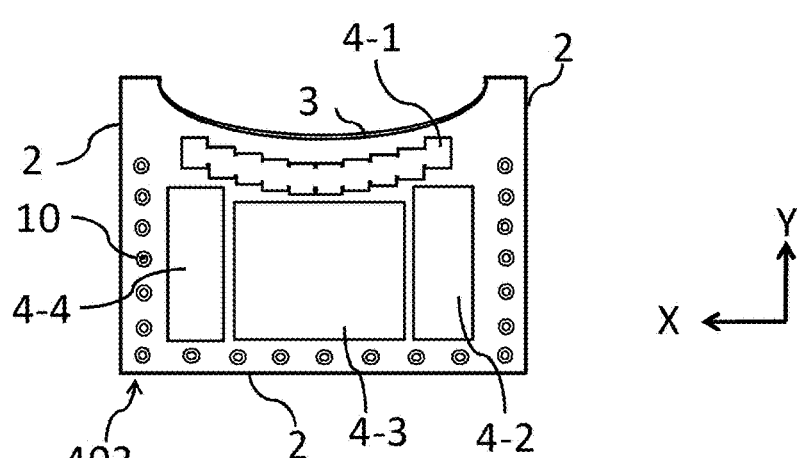

A perspective view of the stacked semiconductor device 400a is shown in FIG. 5(a). Each semiconductor chip 401, 402, and 403 are stacked successively in the semiconductor substrate thickness direction, where electrical contacting means are put between the semiconductor chips. Each semiconductor chip 401, 402, and 403 shown may have the same shape (one side is concave) from the X-Y plane view. FIG. 5(b) shows a plan view of the semiconductor module 400b employing four of the stacked semiconductor devices 400a. With such a configuration, the stacked semiconductor device 400a may be used for a CT scanner, for example, where fan beam type incident X-ray exposure is used. For the purpose of simplicity, only the description below focuses on the differences between FIG. 5(c) and FIG. 4(b) and between FIG. 5(d) and FIG. 4(c). The photo-electric conversion region 7 in FIG. 5(c) may be formed radially in order to suit for the direction of the incident light. The semiconductor device 403 has a concave side face, along which the circuit block 4-1 is formed. With such a configuration, photographed objects like a head and teeth, for example, may be suitably surrounded by the stacked semiconductor device in the imaging system. Especially, a photographed object like a human body or other large sized objects may be suitably surrounded by the stacked semiconductor devices. Conventional CT scanners use two dimensional flat surface area image sensors, and then the incident X-ray beam attenuations may depend on the pixel locations on the flat surface area image sensor as the slice number increases, which may cause the reproduced image problem called an artifact due to the different incident X-ray angles. In this embodiment as explained above, such a reproduced image problem like an artifact may be reduced or alternatively eliminated.

Figure 6A:
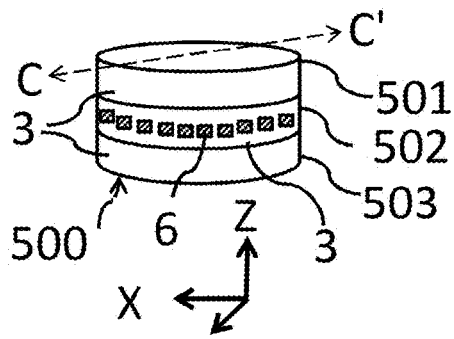
FIG. 6(a) is a diagram illustrating a perspective view of the stacked semiconductor device 500.
Figure 6B:
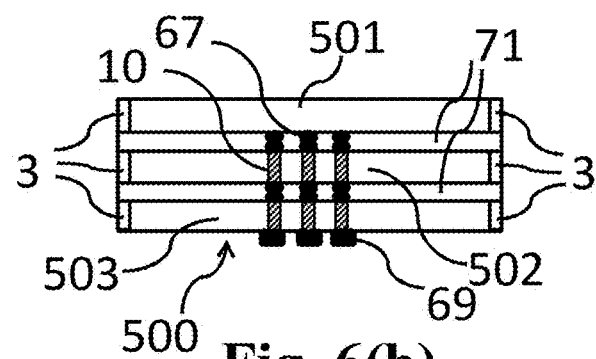
FIG. 6(b) is a diagram illustrating a cross sectional view taken along a dotted line C-C' of the stacked semiconductor device 500 shown in FIG. 6(a).
Figure 6C:
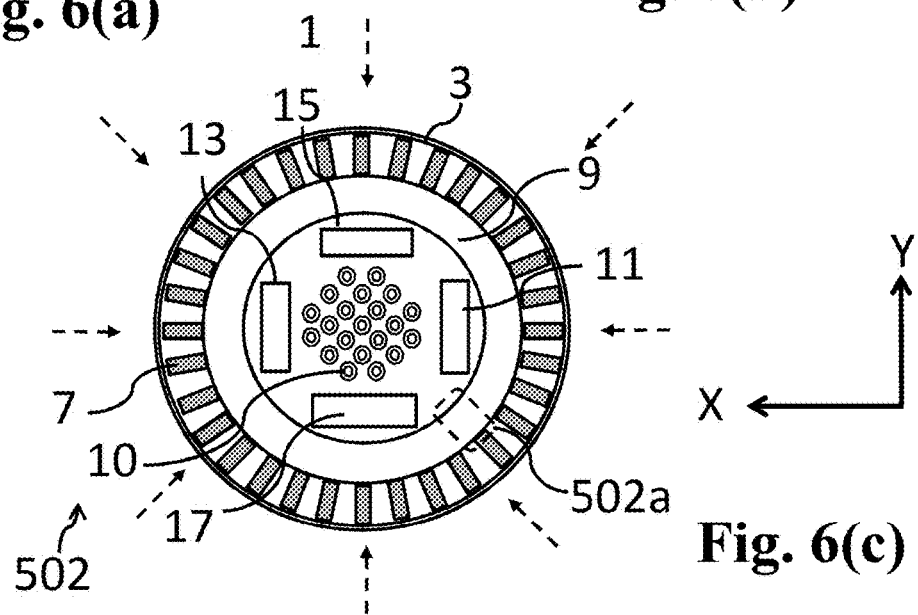
FIG. 6(c) is a diagram illustrating a plan view of the semiconductor chip 502 used in the stacked semiconductor device 500.
Figure 6D:
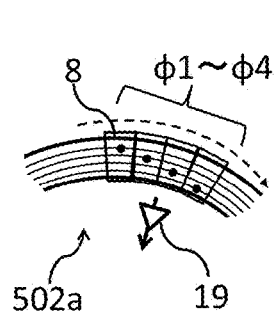
FIG. 6(d) is a diagram illustrating a detailed plan view of the portion 502a shown in FIG. 6(c).
Figure 6E:
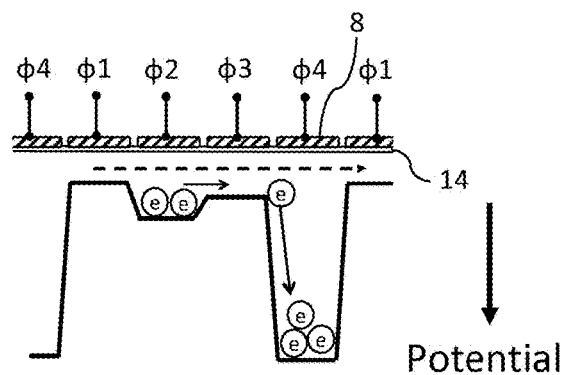
FIG. 6(e) is a diagram illustrating a potential profile under the charge transfer gates 8.

A perspective view of the stacked semiconductor device 500 is shown in FIG. 6(a). Each semiconductor chip 501, 502, and 503 are stacked successively in the semiconductor thickness direction, where electrical contacting means are put between the semiconductor chips. Each semiconductor chip 501, 502, and 503 shown may have the same circular shape from the X-Y plane view. The side face of the stacked semiconductor device 500, that is, the circular side faces of the semiconductor chips 501, 502 and 503 are covered by non-conductive layers 3 such as silicon dioxide layers. The semiconductor chip 502, sandwiched between the semiconductor chips 501 and 503, may be a semiconductor image sensor, for example, where plural optical windows 6 are formed on the above mentioned circular side face. The semiconductor chip 501 may have various circuits to drive and control the semiconductor chip 502, a digital signal processor, and non-volatile memory, for example. The semiconductor chip 503 may have a data buffer-memory, a digital signal processor, and communication interface circuit, for example. A cross sectional view taken along a dotted line C-C' of the stacked semiconductor device 500 in FIG. 6(a) is shown in FIG. 6(b). As explained above, the circular side faces of the semiconductor chips 501, 502 and 503 are covered by the non-conductive layers 3 such as silicon dioxide layers, which may prevent the device reliability deterioration even under the condition of being exposed to the ambient atmosphere, for example. In addition, the stacked semiconductor device 500 can be used even when the device being inserted into cylindrical space. Micro-bumps 67 and micro-pads (not shown in the figure) as electrical contacting means are formed between the semiconductor chips 501 and 502, and 502 and 503 in order to enable electrical connections between these semiconductor chips. The through silicon via (TSV) electrodes 10 are formed in the semiconductor chips 502 and 503 enabling the electrical connections between the front-side and back-side of the semiconductor chips 502 and 503. Non-conductive adhesive layers 71 are sandwiched between the semiconductor chips 501 and 502, 502 and 503 forming one stacked semiconductor device 500. External inputs or outputs pads 69, which may be electrically connected with other devices or parts, are formed on the backside of the semiconductor chip 503 or the bottom of the stacked semiconductor device 500. A circuit diagram of the semiconductor chip 502 from X-Y plan view is shown in FIG. 6(c). The circular side face of the semiconductor chip 502 is covered by the non-conductive layer 3 such as a silicon dioxide layer. The opt-electrical conversion regions 7 are formed radially from the circular side face being covered by the non-conductive layer 3. With such a configuration, incident lights 1 like infrared, visible, or X-ray coming from all directions of 360 degrees may be detected and converted into electrical signals. The length of the opt-electrical conversion regions 7 in the direction of the incoming light may be between ten (10) micron meters and five (5) millimeters long, which may be useful for the detection of infrared or X-ray, for example. The converted electrical signals may be transferred to the digital signal processing circuit 11 through the signal read-out and scanning circuit 9. The other circuit blocks 13, 15, and 17 are a timing pulse generator circuit, an interface circuit, and an input and output buffer circuit, respectively. The plural TSVs 10 are located near the central portion of the semiconductor chip, and then the opt-electrical conversion regions 7 can be formed near and along the side face of the semiconductor chip 502.

In addition, the signal read-out and scanning circuit 9 may include charge transfer path having charge multiplication capability. FIG. 6(*d*) shows a diagram illustrating a detailed plan view of the portion 502*a* marked by the dotted line in FIG. 6(*c*). The charge transfer path may be driven by four-phase charge transfer pulses the charge transfer. The signal charges stored under the series of charge transfer electrode strips 8 may be transferred, and increased by the impact ionization along the direction of the dotted arrow. FIG. 6(*e*) shows a diagram illustrating a potential profile under the charge transfer electrodes (Ref. JP H07-176721). With such a configuration, the charge transfer path having charge multiplication capability may be formed annularly; where higher sensitivity, or the pre-determined tunable sensitivity may be obtained by increasing or changing the number of charge transfer steps or the charge transfer rotation cycles. Further, the shape of the charge transfer path may be kept uniform, and each charge transfer electrodes may be formed same in shape, which may result uniform sensitivity due to the reduced variations on the charge transfer efficiency.

Figure 7A:
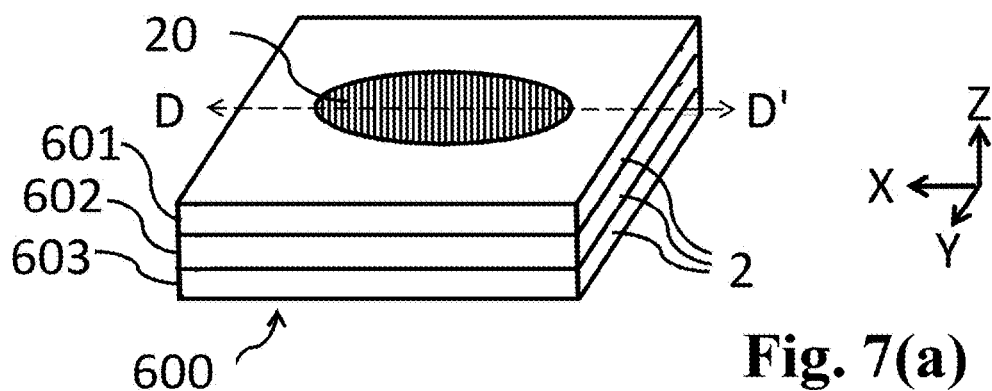
FIG. 7(a) is a diagram illustrating a perspective view of the stacked semiconductor device 600.
Figure 7B:
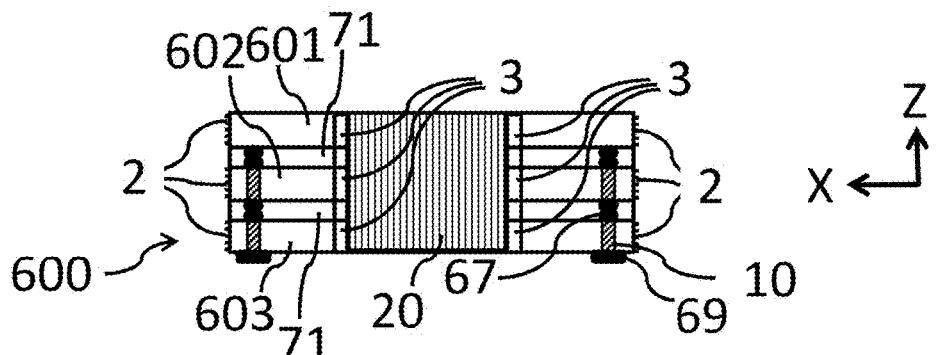
FIG. 7(b) is a diagram illustrating a cross sectional view taken along a dotted line D-D' of the stacked semiconductor device 600 shown in FIG. 7(a).
Figure 7C:
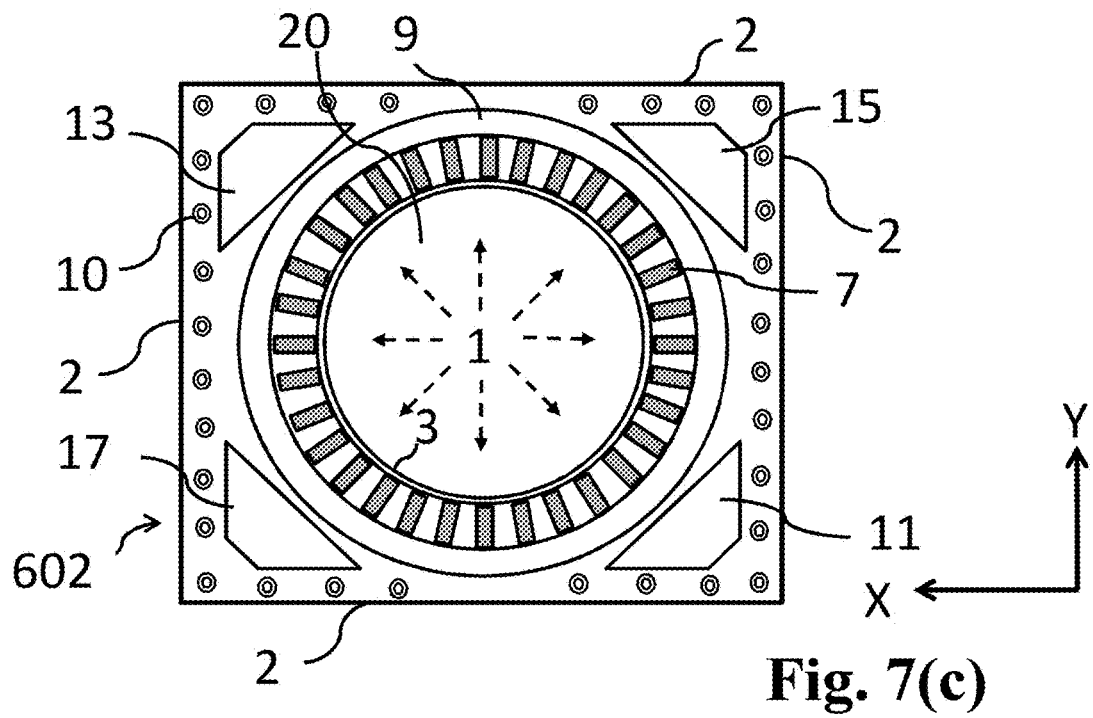
FIG. 7(c) is a diagram illustrating a plan view of the semiconductor chip 602 used in the stacked semiconductor device 600.
Figure 8A:
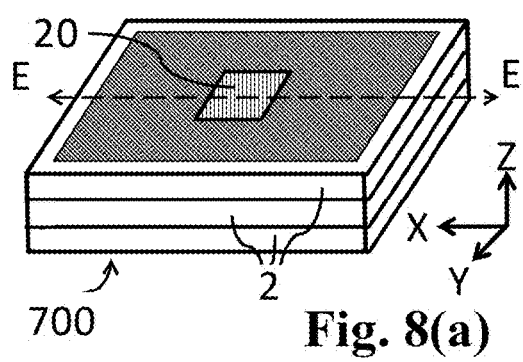
FIG. 8(a) is a diagram illustrating a perspective view of the stacked semiconductor device 700.
Figure 8B:
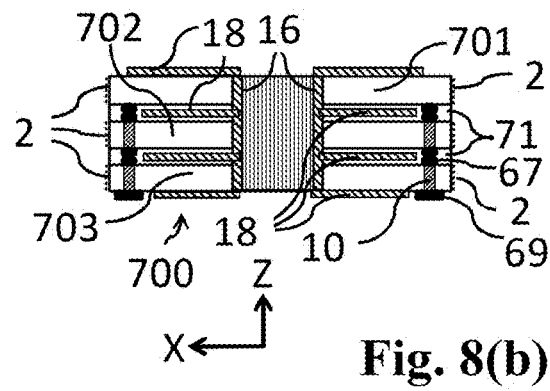
FIG. 8(b) is a diagram illustrating a cross sectional view taken along a dotted line E-E' of the stacked semiconductor device 700 shown in FIG. 8(a).
Figure 8C:
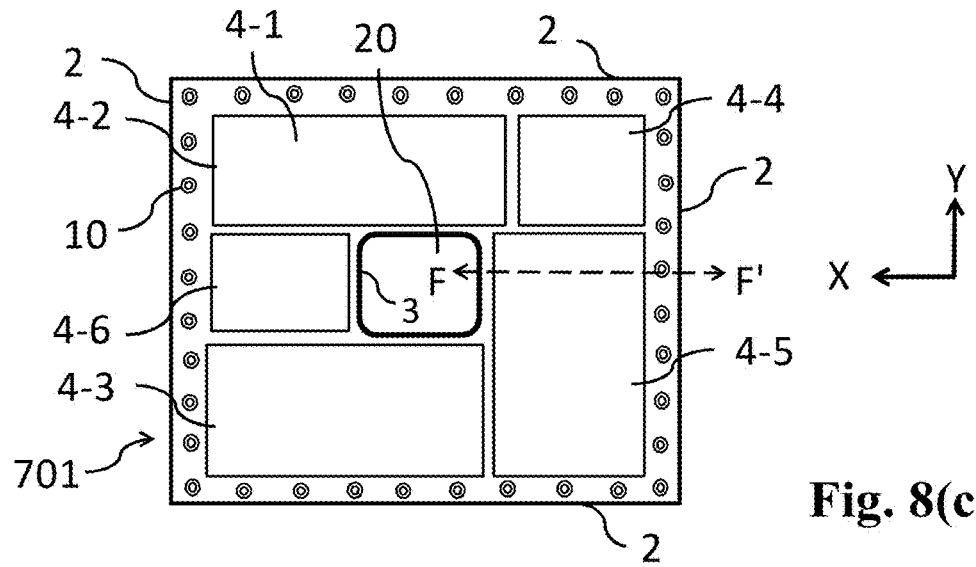
FIG. 8(c) is a diagram illustrating a plan view of the semiconductor chip 701 used in the stacked semiconductor device 700.
Figure 8D:
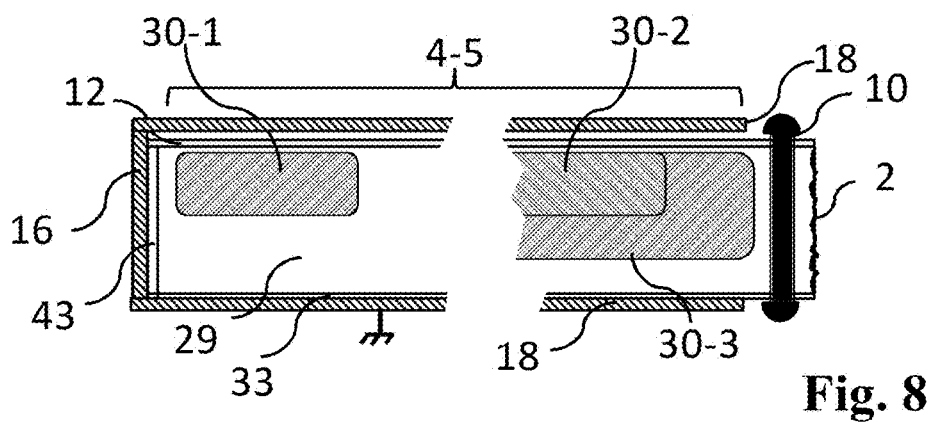
FIG. 8(d) is a cross sectional view taken along a dotted line F-F' of the semiconductor chip 701 shown in FIG. 8(c).
Figure 9A:
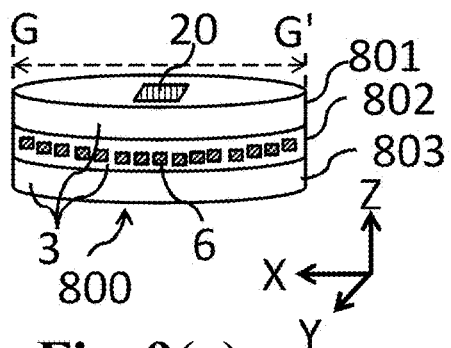
FIG. 9(a) is a diagram illustrating a perspective view of the stacked semiconductor device 800.
Figure 9B:
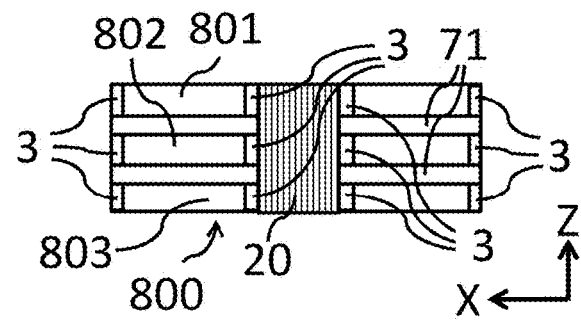
FIG. 9(b) is a diagram illustrating a cross sectional view taken along a dotted line G-G' of the stacked semiconductor device 800 shown in FIG. 9(a).
Figure 9C:
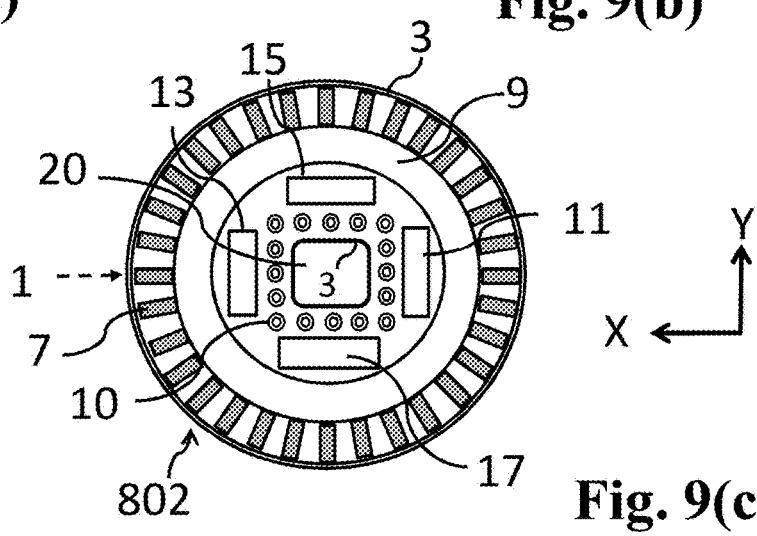
FIG. 9(c) is a diagram illustrating a plan view of the semiconductor chip 802 used in the stacked semiconductor device 800.
Figure 9D:
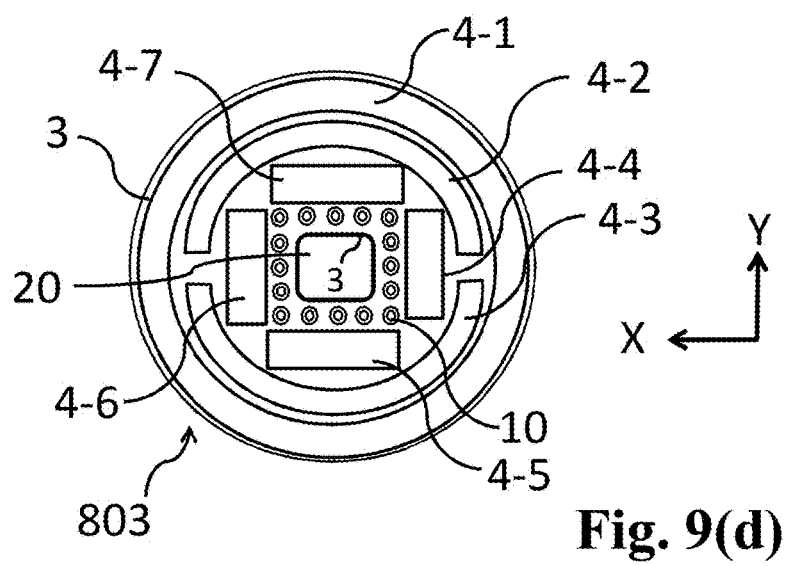
FIG. 9(d) is a diagram illustrating a plan view of the semiconductor chip 803 used in the stacked semiconductor device 800.
Figure 10A:
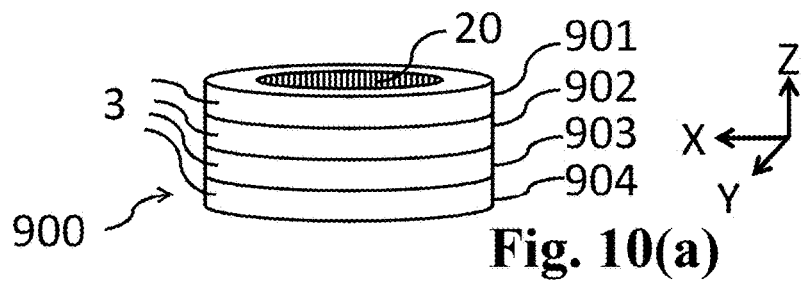
FIG. 10(a) is a diagram illustrating a perspective view of the stacked semiconductor device 900.
Figure 10B:
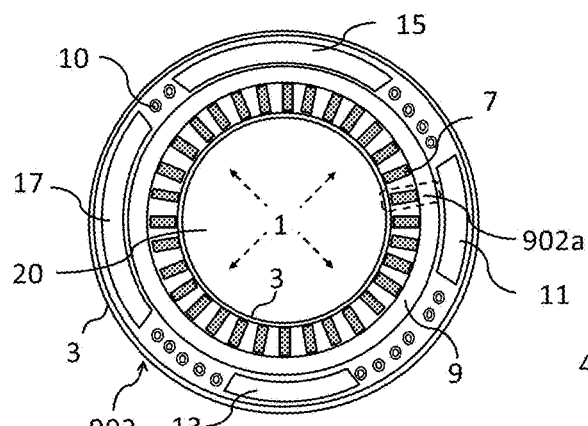
FIG. 10(b) is a diagram illustrating a plan view of the semiconductor chip 902 used in the stacked semiconductor device 900.
Figure 10C:
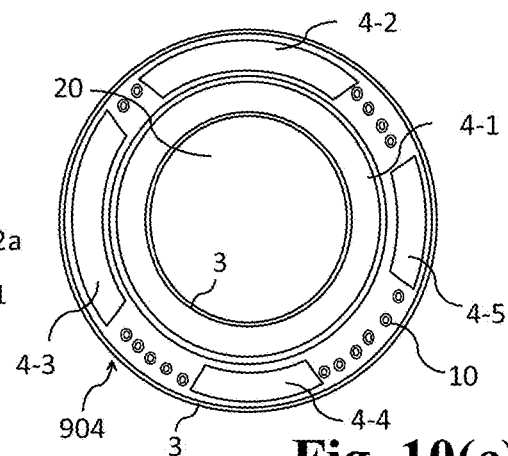
FIG. 10(c) is a diagram illustrating a plan view of the semiconductor chip 904 used in the stacked semiconductor device 900.
Figure 10D:
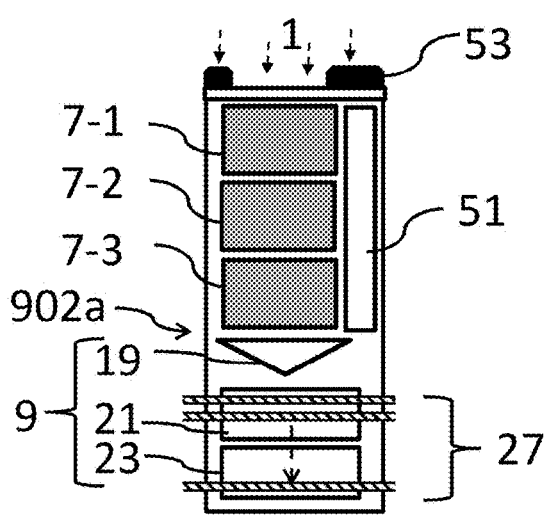
FIG. 10(d) is a diagram illustrating a detailed plan view of the portion 902a shown in FIG. 10(b).
Figure 10E:
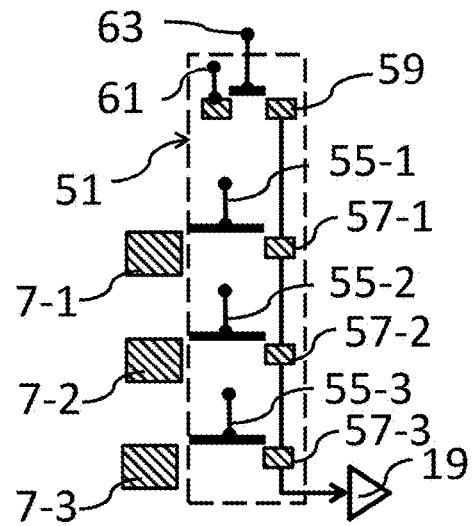
FIG. 10(e) is a diagram illustrating an equivalent circuit of the portion shown in FIG. 10(d).

A perspective view of the stacked semiconductor device 600 is shown in FIG. 7(*a*). Each semiconductor chip 601, 602, and 603 are stacked successively in the semiconductor substrate thickness direction, where electrical contacting means are put between the semiconductor chips. As is discussed greater in detail below, each semiconductor chip 601, 602, and 603 have the same outer shape (rectangular) from the X-Y plane view. The side faces 2 of the semiconductor substrate used in the chips 601, 602 and 603 are exposed to the outside. In this embodiment, a cylindrical hollow 20 through the substrate is formed inside the stacked semiconductor device 600. The semiconductor chip 602 sandwiched between the semiconductor chips 601 and 603 may be a semiconductor image sensor, for example, where plural optical windows 6 (not shown in the figure) are formed on the side face of the hollow 20. The semiconductor chip 601 may have various circuits to drive or control the semiconductor chip 602, a digital signal processor, and non-volatile memory, for example. The semiconductor chip 603 may have a data buffer-memory, a digital signal processor, and a communication interface circuit, for example. A cross sectional view taken along a dotted line D-D' of the stacked semiconductor device 600 is shown in FIG. 7 (*b*). Micro-bumps 67 and micro-pads (not shown in the figure) as electrical contacting means are formed between the semiconductor chips 601 and 602, and 602 and 603 in order to enable electrical connections between these semiconductor chips. The TSVs 10 are formed in the semiconductor chips 602 and 603 enabling the electrical connections between the front-side and back-side of the semiconductor chips 602 and 603. Non-conductive adhesive layers 71 are sandwiched between the semiconductor chips 601 and 602, 602 and 603 forming the stacked semiconductor device 600. External input or output pads 69, which may be electrically connected with other devices or parts, are formed on the backside of the semiconductor chip 603 or on the bottom of the stacked semiconductor device 600. A circuit diagram of the semiconductor chip 602 from X-Y plan view is shown in FIG. 7 (*c*). The circular side face of the hollow 20 of the semiconductor chip 602 may be covered by a non-conductive layer 3 such as a silicon dioxide layer. The opt-electrical conversion regions 7 are formed radially surrounding the hollow 20. With such a configuration, incident lights 1 like infrared, visible, or X-ray coming from almost all directions of 360 degrees may be detected and converted into electrical signals. The length of the opt-electrical conversion regions 7 in the direction of the incoming light may be between ten (10) micron meters and five (5) millimeters long, which may be useful for the detection of infrared or X-ray, for example. The converted electrical signals may be transferred to the digital signal processing circuit 11 through the signal read-out and scanning circuit 9. The other circuit blocks 13, 15, and 17 are timing pulse generator circuit, interface circuit, input and output buffer circuit, respectively. The plural TSVs 10 are located near the outer edges of the semiconductor chip 602, and then the opt-electrical conversion regions 7 can be formed near the hollow 20 inside the semiconductor chip 602. With such a configuration, incident light 1 like an X-ray coming from the area near the center of the hollow, or coming from the direction opposite side of each optical window, may be efficiently detected. The stacked semiconductor device 600 may be manufactured by conventional wafer dicing process. The stacked semiconductor device 600 having hollow 20 may also enable optical spectroscopic analysis of an object locating inside the hollow or blood passing through the hollow, for example.

A perspective view of the stacked semiconductor device 700 is shown in FIG. 8(*a*). Each semiconductor chip 701, 702, and 703 is stacked successively in the semiconductor substrate thickness direction, where electrical contacting means are put between the semiconductor chips. As is discussed greater in detail below, each semiconductor chip 701, 702, and 703 may have the same outer shape (rectangular, for example) from the X-Y plane view. The side faces 2 of the semiconductor chips 701, 702 and 703 are exposed to the outside, for example. In this embodiment, a rectangular hollow 20 through the substrates having four rounded corners is formed inside the stacked semiconductor device 700. As shown in FIG. 8 (*c*), the semiconductor chip 701 may have various circuits to drive or control the semiconductor chip 702, and other circuit blocks (4-1, 4-2, 4-3, 4-4, 4-5, and 4-6). The semiconductor chip 702 may include a digital signal processor, data buffer memory and central processing unit (CPU), for example. The semiconductor chip 703 may have non-volatile memory, communication interface and power supply or control circuits, for example. A cross sectional view taken along a dotted line E-E' of the stacked semiconductor device 700 is shown in FIG. 8 (*b*). The metal layers 18 are formed on the top and bottom surfaces of the stacked semiconductor device 700, between the semiconductor chips 701 and 702, and between 702 and 703, respectively. In addition, a side face metal layer 16 is formed around the hollow 20. More preferably, the metal layers 18 may partially contact the side face metal layer 16. With such a configuration, heat generated in the semiconductor chips 701, 702 and 703 may be successfully radiated outside. Conventionally, it was difficult for a semiconductor chip, which was sandwiched by upper and lower semiconductor chips, to radiate the generated heat, or difficult to include a CPU or high drivability output buffer circuits which are likely to generate heat. However, according to an example embodiment, a heat sink or a cooling fan required by the stacked semiconductor device may be small-sized or alternatively removed. With such a configuration, application system like a small flying object called a drone using the stacked semiconductor device 700 may be become compact in size and weight. A cross sectional view taken along a dotted line F-F' of the semiconductor chip 701 is shown in FIG. 8 (*d*). The semiconductor chip 701 uses a p-type silicon substrate 29, for example. The circuit block 4-5 is CMOS based circuit formed in the N-well 30-1, P-well 30-2, and N-well 30-3, which are surrounded by surface non-conductive layer 12, highly impurity doped region 43 and backside highly impurity doped region 33. TSVs 10 are formed near the periphery of the semiconductor chip 701, which may separate the circuit block 4-5 from the exposed side face 2 of the silicon substrate.

A perspective view of the stacked semiconductor device 800 is shown in FIG. 9(*a*). Each semiconductor chip 801, 802, and 803 is stacked successively in the semiconductor substrate thickness direction, where electrical contacting means are put between the semiconductor chips. Each semiconductor chip 801, 802, and 803 shown in the FIG. 9(*a*) may have the same circular shape from the X-Y plane view. The circular side faces of the semiconductor chips 801, 802 and 803 are covered by non-conductive layers 3 such as silicon dioxide layers. The semiconductor chip 802 sandwiched between the semiconductor chips 801 and 803, may be a semiconductor image sensor, for example, where plural optical windows 6 are formed on the side face. The semiconductor chip 801 may have various circuits to drive and control the semiconductor image sensor 802, a digital signal processor, and non-volatile memory, for example. The semiconductor chip 803 may have a data buffer-memory, a digital signal processor, and communication interface circuit, for example. In this embodiment, a rectangular hollow 20 having four rounded corners through the substrates is formed inside the stacked semiconductor device 800. A cross sectional view taken along a dotted line G-G' of the stacked semiconductor device 800 is shown in FIG. 9(*b*). The side faces of the hollow 20 formed in the semiconductor chips 801, 802 and 803 are covered by the non-conductive layers 3 such as silicon dioxide layers, which may prevent the device reliability deterioration even under the condition of being exposed to the ambient atmosphere. Plan block diagrams of the semiconductor chips 802 and 803 used in the stacked semiconductor device 800 are shown in FIG. 9(*c*) and FIG. 9(*d*), respectively. With such a configuration, it may become easy to insert the cylindrical stacked semiconductor device 800 into a tube like a test-tube or a catheter, for example. Further, a signal cable or an optical fiber can be passed through the hollow 20, and some gas or liquid may be injected into the hollow in order to cool the stacked semiconductor device 800, for example.

A perspective view of the stacked semiconductor device 900 is shown in FIG. 10(*a*). Each semiconductor chip 901, 902, 903 and 904 is stacked successively in the semiconductor substrate thickness direction, where electrical contacting means are put between the semiconductor chips. Each semiconductor chip 901, 902, 904 and 904 shown in the FIG. 10(*a*) may have the same shape (doughnut shaped, for example) from the X-Y plane view. The outer side face of the stacked semiconductor device 900 in the figure, that is, the side faces of the semiconductor chips 901, 902, 903 and 904 are covered by non-conductive layers 3 such as silicon dioxide layers. The semiconductor chips 902 and 903 sandwiched between the semiconductor chips 901 and 904 are semiconductor image sensors, for example, where plural optical windows 6 are formed on the side faces. The semiconductor chip 901 may have various circuits to drive and control the semiconductor chip 902 and 903, a digital signal processor, and non-volatile memory, for example. The semiconductor chip 904 may have a data buffer-memory, a digital signal processor, and communication interface circuit, for example. In this embodiment, the stacked semiconductor device 900 has a hollow 20 through the semiconductors chips to form a ring in shape from the plan view. The circular side faces of the hollows formed in semiconductor chips 901, 902, 903 and 904 are covered by the non-conductive layers 3 such as silicon dioxide layers, which may prevent the device reliability deterioration even under the condition of being exposed to the ambient atmosphere, for example. Plan views of the semiconductor chips 902 and 904 used in the stacked semiconductor device 900 are shown in FIGS. 10(*b*) and 10(*c*), respectively. Details on the integrated circuit blocks may be same as those explained in the above embodiments. As shown in these figures, it is suitable to detect the incident light 1 such as an X-ray irradiating from the near center of the ring, or from the opposite side of pixels or optical windows. The stacked semiconductor device 900, which was formed on a large size silicon wafer, may surround an object. As a result, a compact size CT scanner, for example, may be realized for imaging a part of body like a head and small animals with a high speed and low power consumptions owing to the on-chip signal processing.

FIG. 10(*d*) shows a diagram illustrating a detailed plan view of the portion 902*a* marked by the dotted line in FIG. 10(*b*), where a MOS type image sensor configuration is introduced, for example. FIG. 10(*e*) is a diagram illustrating an equivalent circuit of the portion shown in FIG. 10(*d*). The photo-electric conversion region 7 is divided into three areas (7-1, 7-2 and 7-3), for example. Electric charges generated in these three areas, via the adjacent MOS type signal transfer circuit 51, may be read out individually or added all together by the FDA of the signal charge detection circuit 19 and sent to the analog to Digital converter circuit 21. Signal transfer electrodes 55-1, 55-2, 55-3 may be turned on when the signal charges are read out from the photo-electric conversion region to the input terminals of the signal charge detection circuit 19 or the floating diffusions (57-1, 57-2, 57-3, 59). Then the floating diffusions may be reset to the electric potential of the reset drain 61 by turning on the reset terminal 63. As shown in FIG. 10(*d*), MOS type signal transfer circuit 51 may be located under the optical shield 53. Preferably, the optical shield 53 may contain heavy metals such as tungsten, for example, which may attenuate the incident X-ray, and may reduce MOS device radiation damage. The circuit blocks such as 21, 23 and 27 may be same as explained above in FIG. 2 (*a*). With such a configuration, the large sized stacked semiconductor device 900 may consume less electric power than the case based on the CCD type image sensor.

Figure 11A:
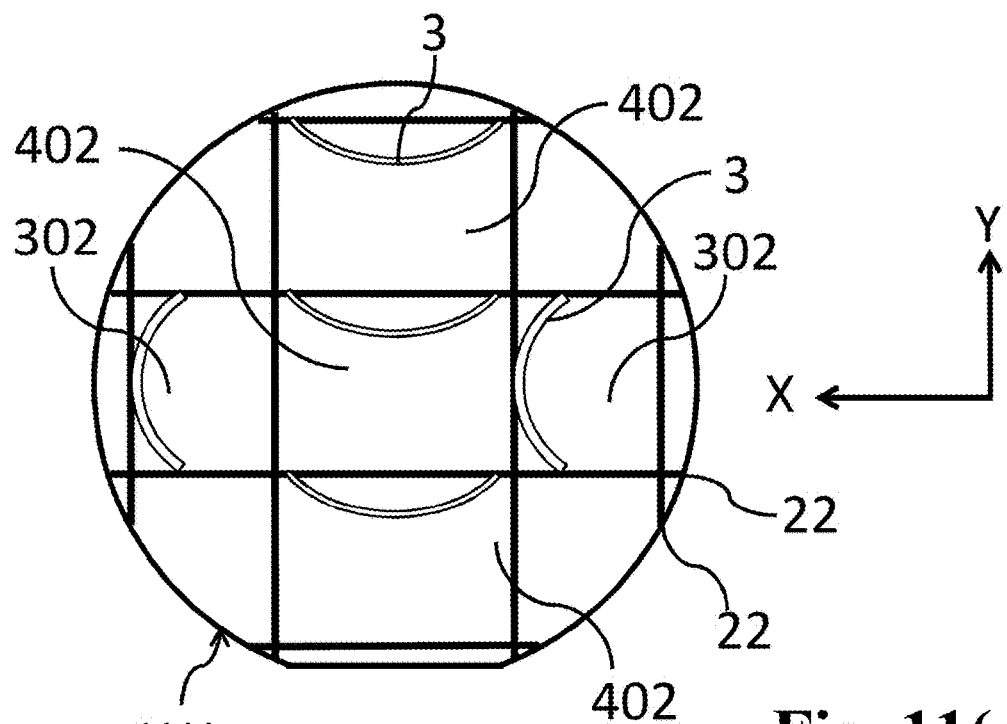
FIG. 11(a) is a diagram illustrating an X-Y plan view of the semiconductor wafer W1 on which semiconductor chips 302 and 402 are formed.
Figure 11B:
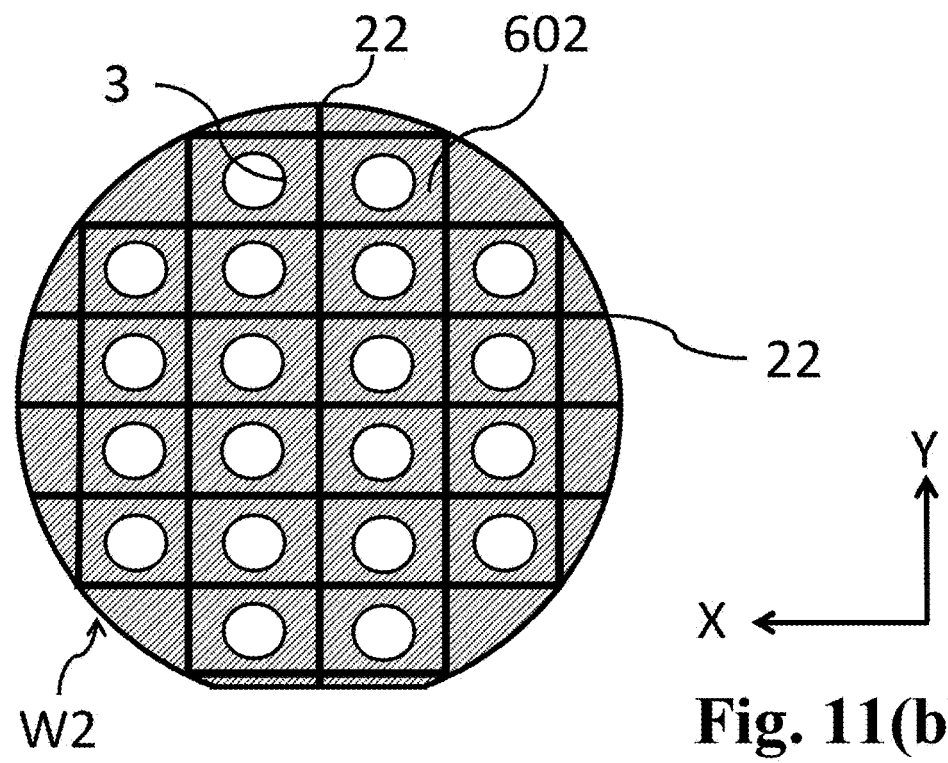
FIG. 11(b) is a diagram illustrating an X-Y plan view of the semiconductor wafer W2 on which semiconductor chips 602 are formed.
Figure 12:
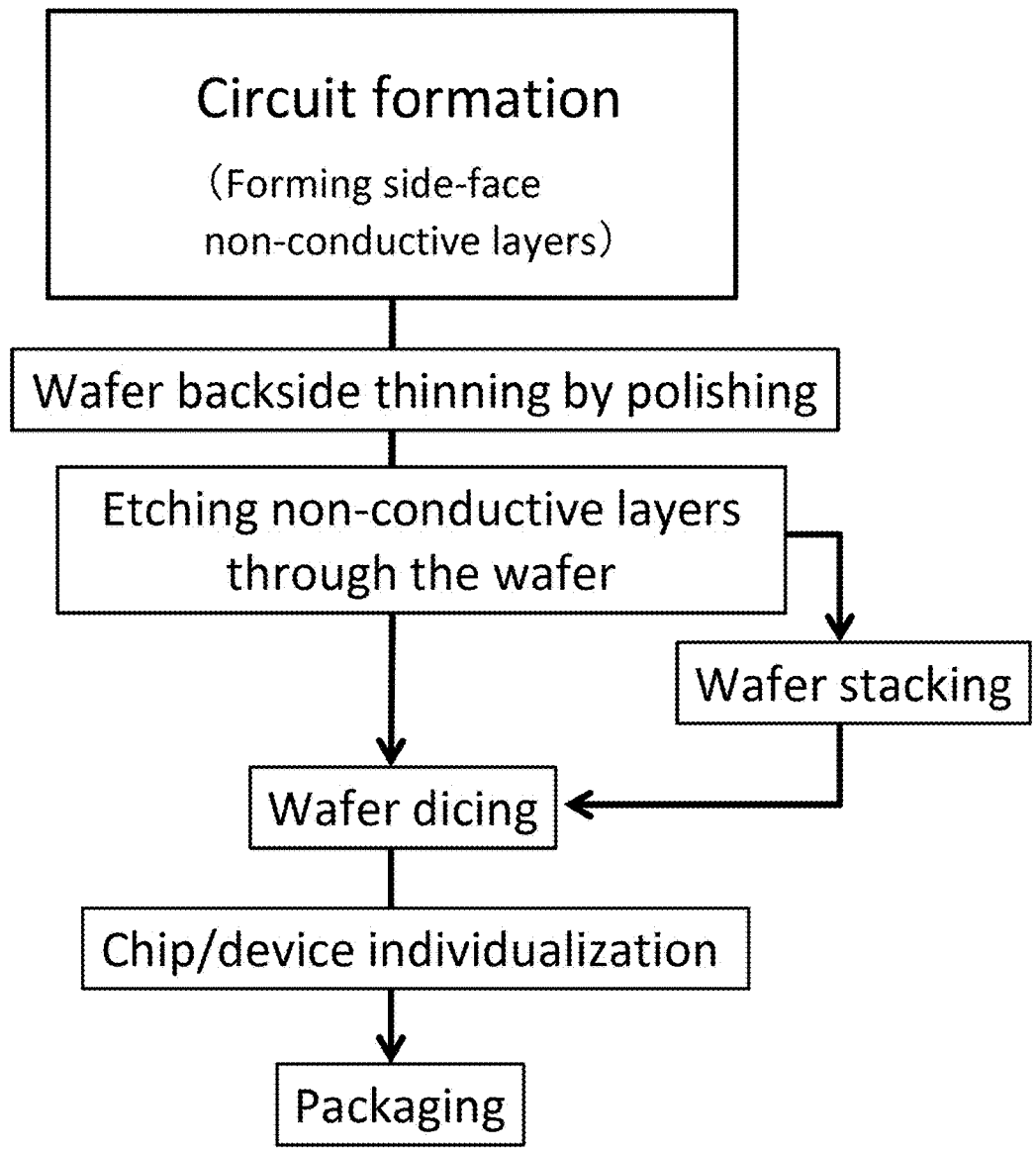
FIG. 12 is a flow chart outlining a method for manufacturing process according to at least one example embodiment.

Detailed example embodiments on the methods of manufacturing above mentioned semiconductor devices are disclosed referring to the FIGS. 11 to 16. Manufacturing process of the above mentioned semiconductor chips or stacked semiconductor devices may include a wafer processing steps of forming a side face non-conductive layer, and may include a wafer processing step of dividing a wafer into individual semiconductor chips, or may include a stacked wafers dividing into individual stacked semiconductor devices leaving the above mentioned non-conductive layers. As shown in FIG. 11(*a*), for example, semiconductor chips 302 having convex side faces and semiconductor chips 402 having concave side faces, on which non-conductive layers 3 are formed; are patterned (imposed) on the wafer W1. The rest of other side faces will become bare silicon substrate side faces being exposed to the outside, and then each chip may be divided along the scribe lines 22 by wafer dicing. As shown in FIG. 11(*b*), for example, semiconductor chips 602 having hollows on which non-conductive layers 3 are formed, are patterned (imposed) on the wafer W2. The rest of other side faces, after the individualization, may be bare silicon substrate side faces being exposed to outside, and then each chip may be divided along the scribe lines 22 by wafer dicing. With this manufacturing method, the conventional back-end process, that is, a wafer dicing process can be used. Further, as is discussed in greater detail below, the above mentioned manufacturing method may also be applicable to that of the stacked semiconductor devices. FIG. 12 is a flow chart outlining a method for a manufacturing process according to at least one example embodiment. First, circuits may be formed on the semiconductor wafer. As explained below, this circuit formation process steps may include formation steps of the side face non-conductive layer 3. Then, the semiconductor wafer may be thinned down to 10 to 100 micron meters in thick by backside thinning step. In next operation, the side face non-conductive layer may be etched through the silicon substrate by plasma etching, for example. In next operation, wafers may be stacked to form a stacked semiconductor device. In next operation, the wafer or the stacked wafers may be divided by a wafer dicing machine along the scribe lines to get each individual chip or stacked device, which may be followed by a packaging process.

Figure 13A:
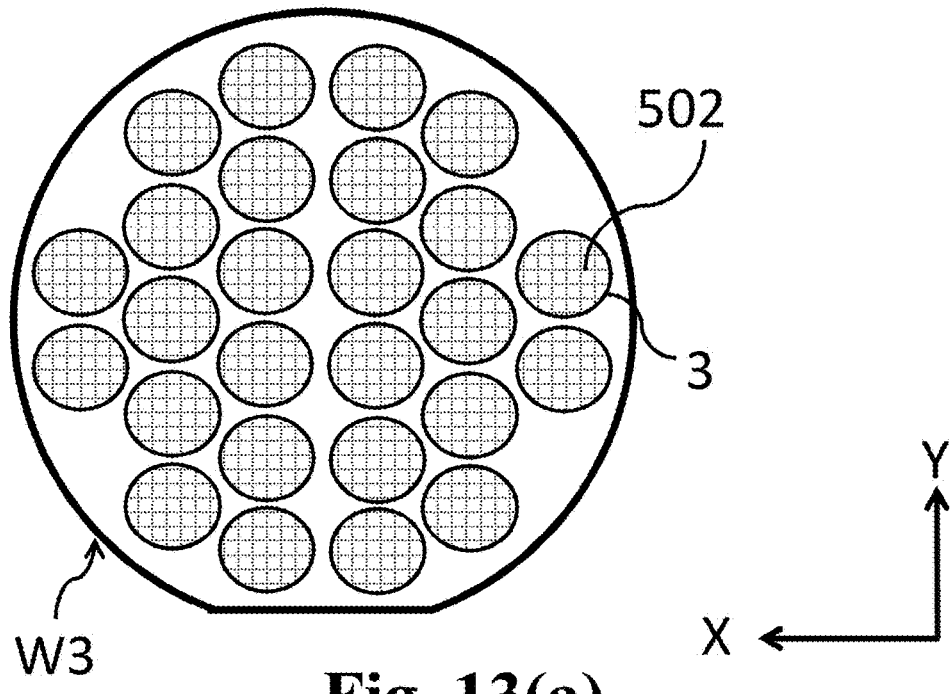
FIG. 13(a) is a diagram illustrating an X-Y plan view of the semiconductor wafer W3 on which semiconductor chips 502 are formed.
Figure 13B:
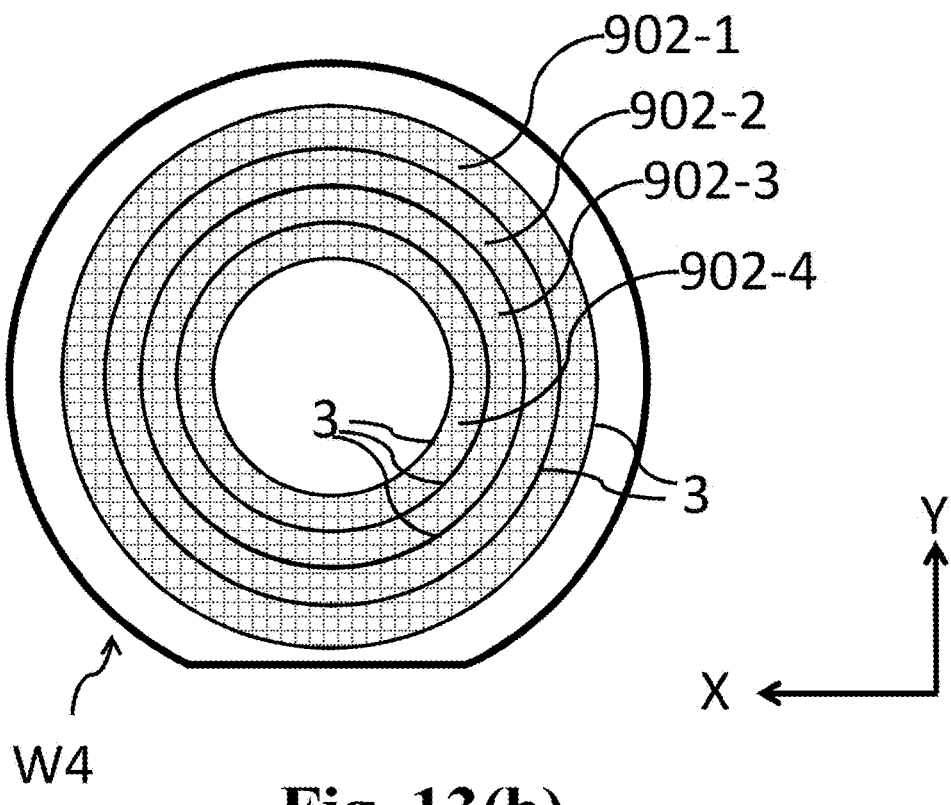
FIG. 13(b) is a diagram illustrating an X-Y plan view of the semiconductor wafer W4 on which semiconductor chips 902-1, 902-2, 902-3, and 902-4 are formed.

As shown in FIG. 13(a), for example, semiconductor chips 502, which may have an outer side face covered by non-conductive layers 3, are patterned on the wafer W3. Similarly, as shown in FIG. 13(b), for example, semiconductor chips 902-1, 902-2, 902-3 and 902-4, which may have hollows with different diameters, and outer side faces covered by non-conductive layers 3, are patterned on the wafer W4.

Figure 14:
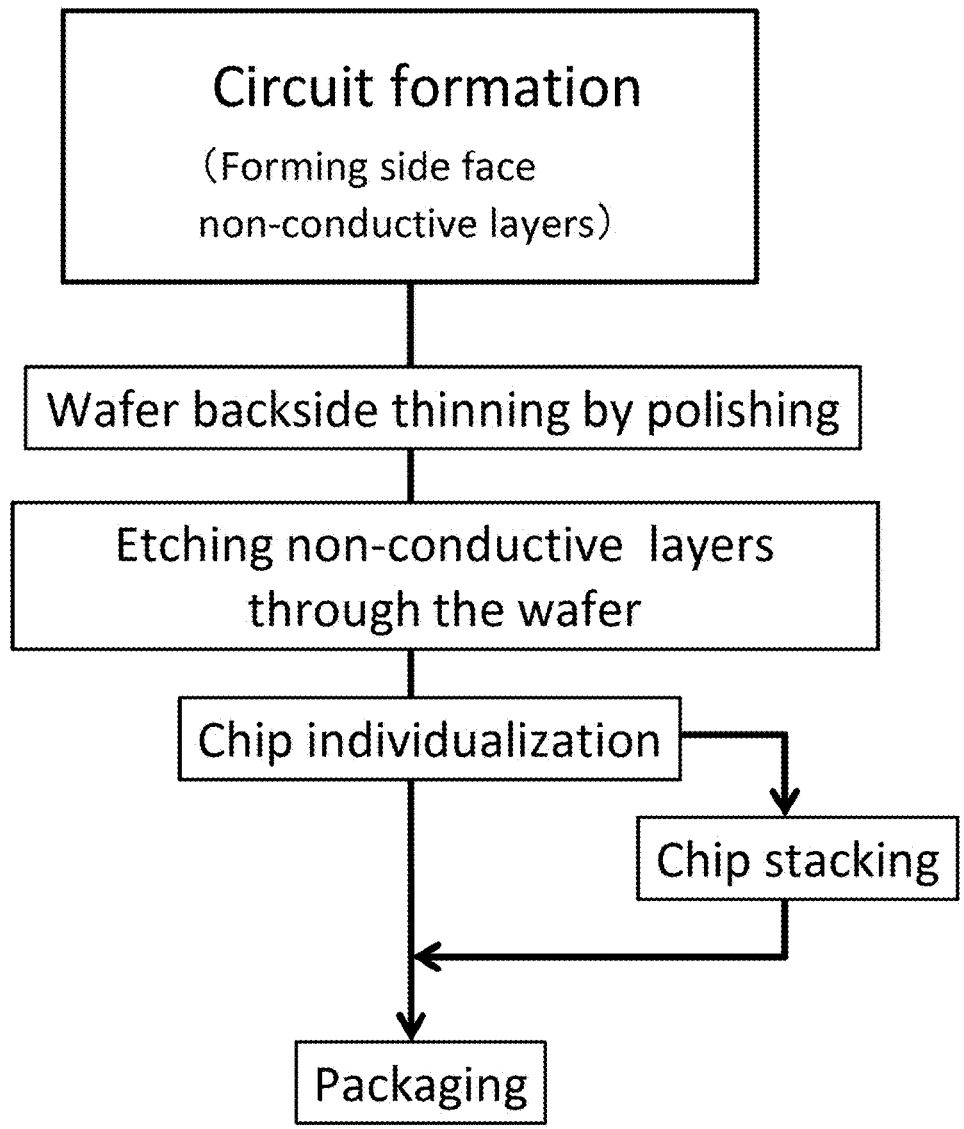
FIG. 14 is a flow chart outlining a method for manufacturing process according to at least one example embodiment.
Figure 16A:
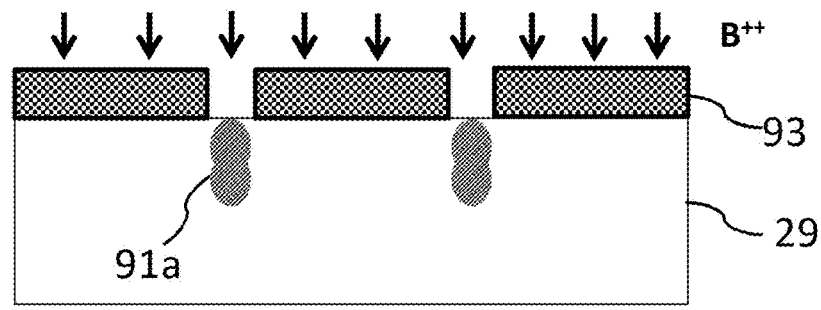
FIGS. 16(a) to 16 (d) are cross sectional views that schematically outline a method for manufacturing process according to at least one example embodiment.
Figure 16B:
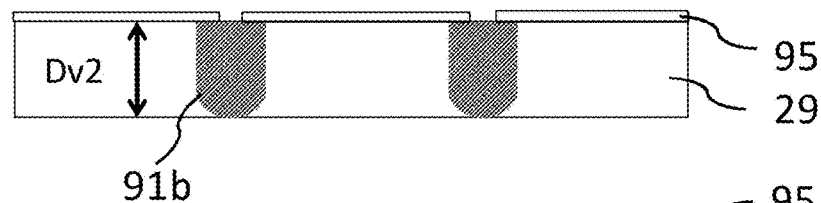
Figure 16C:
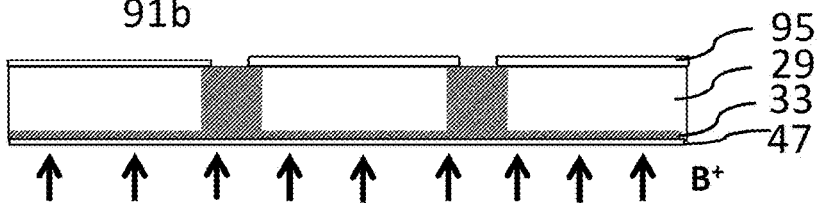
Figure 16D:
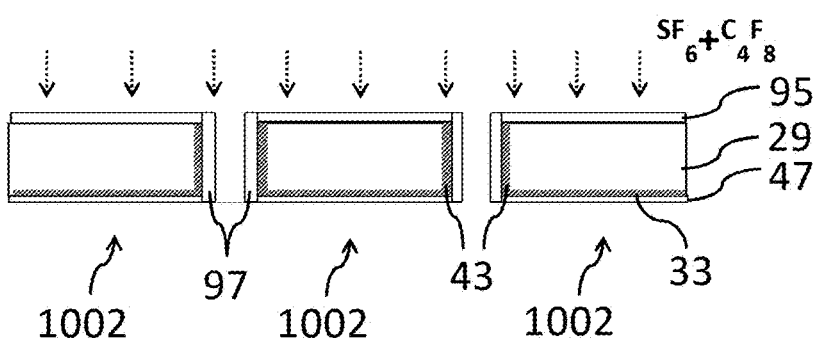

FIG. 14 is a flow chart outlining a method for manufacturing process according to at least one example embodiment. First, circuits may be formed on the semiconductor wafer. As explained below, this circuit formation process steps may include formation steps of the side face non-conductive layer 3. Then, the semiconductor wafer may be thinned down to 10 to 100 micron meters in thick by backside polishing step. In next operation, the non-conductive layers formed on both the chip's and hollow's side faces may be etched through the silicon substrate by plasma etching, for example. In next operation, individual chips 502, or chips 902-1 to 902-4 may be stacked to form a stacked semiconductor device, which may be followed by packaging process. With this manufacturing method, chip individualization process may be performed during the above mentioned etching process simultaneously because each chip outer face is covered by the sidewall non-conductive layer. Furthermore, a semiconductor chip having a curved outer side face may be easily formed by patterning process without other wafer dicing process. Without using a rotating blade or laser saw for the wafer dicing process, wafer chippings or cracking, and re-adhesion of the molten semiconductor material generated by the laser heating used for the dicing process may not be observed. In addition, conventionally, a certain amount of semiconductor materials are lost during the blade dicing or the laser saw dicing process; which makes it difficult to realize fine chip outer forms. With the manufacturing method according to one or more example embodiments, however, fine chip outer forms may be realized with a limited material loss; which may result more chips being separated from a wafer being used.

Referring to FIGS. 15 and 16, detailed manufacturing methods regarding some example embodiments are discussed below. The example embodiments may relate to the manufacturing methods of forming the side face non-conductive layer and etching the side face non-conductive layer in detail as discussed in FIGS. 12 and 14 above. For the purpose of simplicity, the cross sectional views may display some specific parts including the side face of the semiconductor substrate, where the non-conductive layer is formed, or the area to be separated into each chip, for example. Other internal circuits, input or output buffer circuits and through silicon vias are intentionally omitted from the figures.

FIG. 15(a) shows a cross sectional view of forming a P-well in the early manufacturing stage, for example. Divalent boron ions ($B^{++}$) may be implanted into the substrate using the photo-resist pattern 77 as a mask using a high energy ion implanter of more than several mega-electron volts (MeV) acceleration energy. The implanted area may also include other parts such as isolation regions. Removing the photo-resist, high temperature thermal diffusion (drive-in) process may be carried out in order to diffuse implanted impurity 79a deeper into the substrate during the p-well formation.

In the next operation as shown in FIG. 15(b), the silicon substrate may be dry-etched to form trenches 85 using masks of silicon dioxide 81 and silicon nitride 83 layers in a gaseous atmosphere including sulfur hexafluoride ($SF_6$), for example. The depth of the trench 85 may be equal to Dt but smaller than the horizontal pixel pitch Dh shown in FIG. 3(a), for example. After the above mentioned boron ion implantation and the subsequent thermal diffusion, the sidewalls of the trenches 85 may be surrounded by the p-type impurity distributions 79b.

In the next operation as shown in FIG. 15(c), the side walls of the trenches may be oxidized to form silicon dioxide layer ($SiO_2$) 45. Then, the trenches 85 are refilled with silicon dioxide ($SiO_2$) 87 by CVD method.

In next operation as shown in FIG. 15(d), the silicon dioxide layer on the front face of the silicon substrate may be removed and flattened by a chemical mechanical polishing (CMP) method. Then, the backside of the silicon substrate may be thinned down to the predetermined thickness such as Dv1=Dt, for example, followed by the formation of the silicon dioxide layer ($SiO_2$) 45. In next operation, monovalent boron ions are implanted into the backside of the silicon substrate to form the shallow and highly impurity doped layer 33.

In next operation as shown in FIG. 15(e), the CVD silicon dioxide ($SiO_2$) 87 near the sidewall is etched away to separate each semiconductor chip 1001 using the photo-resist pattern 89 by anisotropic plasma etching in a gaseous atmosphere including carbon tetrafluoride ($CF_4$) and oxygen ($O_2$), for example. In the case shown in FIG. 12 which includes the wafer dicing process, only the portion covered by the sidewall non-conductive layer may be etched by the anisotropic plasma etching method. With this manufacturing method, the silicon dioxide layer ($SiO_2$) and its underneath high concentration impurity region are formed on the light receiving side face of the semiconductor substrate before the wafer dicing process. As a result, characteristic degradation such as noise and defective pixels caused by semiconductor surface states or crystal lattice defects may be reduced even in the case when the image sensors having image receiving side faces, and being separated by the following dicing process. Or, a larger number of small sized image sensors are individualized with higher yield by a patterning and etching process without using a rotating blade for the dicing. The side face of the semiconductor substrate of the light receiving face may be easily processed and formed such as a curved or any other in shape.

In order to flatten or clean the side face of the semiconductor substrate, a new silicon dioxide layer ($SiO_2$) 45 may be formed after above mentioned CVD silicon dioxide (87) and silicon dioxide layer (45) etching and surface flattening process.

Referring FIG. 16, other manufacturing method regarding example embodiments are discussed below. The example embodiments may relate to the manufacturing methods of forming the side face non-conductive layer and etching the side face non-conductive layer in detail as shown in FIGS. 12 and 14. For the purpose of simplicity, the cross sectional views may display some specific parts including the side face of the semiconductor substrate, where the non-conductive layer is formed, or the area to be separated into each chip, for example. Other internal circuits, input or output buffer circuits and through silicon via are intentionally omitted from the figures.

FIG. 16(*a*) shows a cross sectional view of forming a P-well in the early manufacturing stage, for example. Divalent boron ions ($B^{++}$) may be implanted into the substrate using the photo-resist pattern 93 as a mask by a high energy ion implanter of more than several mega-electron volts (MeV) acceleration energy. The implanted area may also cover other parts such as isolation regions.

As shown in FIG. 16(*b*), removing the photo-resist, high temperature thermal diffusion (drive-in) process may be carried out in order to diffuse implanted impurity 91*a* deeper into the substrate to form the impurity profile 91*b* by a high temperature thermal diffusion (drive-in) as well as the p-well formation. In the next operation, the silicon substrate may be thinned down to the predetermined thickness (Dv2=Dt, for example). Then, the silicon dioxide layer 47 is formed on the backside of the silicon substrate, and monovalent boron ions are implanted to form thin heavily doped impurity region 33, as shown in FIG. 16(*c*).

In the next operation as shown in FIG. 16(*d*), each semiconductor chip 1002 is individualized by reactive ion etching (RIE), alternately in a gaseous atmosphere including sulfur hexa-fluoride ($SF_6$) and in a gaseous atmosphere including octafluorocyclobutane ($C_4F_8$), using a mask such as silicon dioxide layer 95 or a resist. In the case shown above in FIG. 12 which includes the wafer dicing process, only the portion covered by the sidewall non-conductive layer may be etched away by the reactive ion etching method. With this etching process, a thick semiconductor substrate of more than tens of micron meters may be easily cut off with a high etching rate, and a protective layer may be deposited on the side face with a high aspect ratio by the alternate use of octafluorocyclobutane ($C_4F_8$) and sulfur hexa-fluoride ($SF_6$). The rough side face may be annealed and flattened under low pressure hydrogen atmosphere (10 Torr, 1100° C., for example), or if necessary, a new silicon dioxide layer 45 (not shown in the figure) may be deposited on the side face of the silicon substrate after removing the deposited protective layer 97.

With this manufacturing method according to the example embodiment, the silicon dioxide layer ($SiO_2$) and its underneath high concentration impurity region are formed on the light receiving side face of the semiconductor substrate even before the wafer dicing process, where characteristic degradation such as noise and defective pixels caused by semiconductor surface states or crystal lattice defects may be reduced. In addition, each image sensor may be individualized by only a patterning and etching process with higher speed, which also enables the formation of a curved, or any other fine-shaped, light receiving side face. This manufacturing method may be suitable for a large sized image sensor for X-ray imaging having a large pixel size or a thick silicon substrate (Dv2), for example.

INDUSTRIAL APPLICABILITY

According to the above embodiments, both small and wafer sized semiconductor devices applicable to photographed objects in various outer shapes, for example. Hybrid imaging apparatuses meeting the user needs, where a stacked semiconductor device includes different types of semiconductor chips, may be realized. An endo-scope, a laparoscope, PET-CT, a radio-isotope imaging system, a near-infrared coherent tomography, a near-infrared brain topography and an ultrasonic imaging apparatus, which enable multi-functional imaging diagnostics, may be realized, for example. With these apparatuses, diagnostic accuracy may be improved and, further, medical expenses and pains to a patient may be reduced. Besides the imaging fields, the stacked semiconductor device may be used in wearable systems, mobile communication terminals, robotics, and weight saving small air crafts or vehicles, for example.

SYMBOL LIST

1: Incident light,
2: Exposed side face of semiconductor substrate,
3: Side face covered by non-conductive layer,
4-1, 4-2, 4-3, 4-4, 4-5, 4-6, and 4-7: Integrated circuit blocks,
6: Pixel,
7, 7-1, 7-2, and 7-3: Photo-electric conversion region,
8: Poly-silicon electrode,
9: Signal read-out and scanning circuit,
10: Through Silicon Via (TSV),
11: Digital signal processing circuit,
12: Surface non-conductive layer,
13: Timing pulse generator circuit,
14: Gate oxide layer,
15: Interface circuit,
16: Side face metal layer,
17: Input and output buffer circuit and electrical contact terminal,
18: Metal layer,
19: Signal charge detection circuit,
20: Hollow,
21: Analog to Digital converter circuit,
22: Scribe line,
23: Scanning circuit,
25: Four phase charge transfer electrodes,
27: Wiring group,
29: Semiconductor substrate,
30-1: N-well,
30-2: P-well,
30-3: N-well,
31: Isolation region,
33: Backside highly impurity doped region,
35: Output gate,
37: Reset gate,
39: Reset drain,
41: Floating diffusion,
43: Highly impurity doped region underneath the side face covered by non-conductive layer,
45: Silicon dioxide layer formed on the side face,
47: Backside silicon dioxide,
49: Backside optical shield, 51: MOS type signal transfer circuit,
53: Optical shield on a light receiving face, 55-1, 55-2, 55-3: Signal transfer electrodes,
57-1, 57-2, 57-3, 59: Floating diffusion,
61: Reset drain,
63: Reset terminal,
67: Micro-bump,
69: Input and output pads,
71: Adhesive layer,
73: Scintillator,
75: Color filter,
77: Resist mask,
79a: Impurity profile after ion implantation,
79b: Impurity profile after thermal diffusion and trench etching,
81: Silicon dioxide,
83: Silicon nitride,
85: Trench,
87: CVD silicon dioxide,
89: Resist mask,
91a: Impurity profile after ion implantation,
91b: Impurity profile after thermal diffusion,
93: Resist mask,
95: Silicon dioxide,
97: Deposited side face protective layer,
101, 102, 103, 201, 201a, 201b, 201c, 301, 302, 303, 401, 402, 403, 501, 502, 503, 601, 602, 603, 701, 702, 703, 801, 802, 803, 901, 902, 903, 904: Semiconductor chips,
100, 200a, 200b, 300, 400a, 400b, 500, 600, 700, 800, 900: stacked semiconductor devices,
W1, W2, W3, W4: Semiconductor wafers used in the example embodiments,
902-1, 902-2, 902-3, 902-4: Circular semiconductor chips concentrically formed on the semiconductor wafer W4,
1001, 1002: Separated semiconductor chips from the wafer used in the example embodiments.

The invention claimed is:

1. A semiconductor device comprising:
a stacked structure including a plurality of semiconductor chips stacked successively in a first direction that is parallel to a Z-axis, the plurality of semiconductor chips being electrically connected to each other through electrical contacts located in between adjacent pairs of semiconductor chips among the plurality of semiconductor chips,
each of the plurality of semiconductor chips including,
a top surface that is parallel to an X-Y plane defined by an X-axis and a Y-axis,
a bottom surface that is opposite the top surface and parallel to the X-Y plane, and
a plurality of side surfaces that are parallel to the Z-axis, the plurality of side surfaces including,
a first side surface that includes a continuous curve with respect to the X-Y plane, and
second through fourth side surfaces,
a length of the continuous curve being greater than half an entire length of the first side surface with respect to the X-Y plane,
the stacked structure having a 4-sided footprint with respect to the X-Y plane,
the 4-sided footprint being defined by the first through fourth side surfaces of each of the plurality of semiconductor chips.

2. The semiconductor device of claim 1 wherein,
the first side surfaces of the plurality of semiconductor chips are covered by a non-conductive layer, and the second through fourth side surfaces of the plurality of semiconductor chips are not covered by a silicon dioxide (SiO$_2$) layer.

3. The semiconductor device of claim 1, wherein one or more semiconductor chips from among the plurality of semiconductor chips include a plurality of through silicon via (TSV) electrodes located in peripheral portions of the one or more semiconductor chips adjacent to the second through fourth side surfaces of the one or more semiconductor chips.

4. The semiconductor device of claim 1 wherein the continuous curves of the first side surfaces of the plurality of semiconductor chips are convex with respect to the X-Y plane.

5. The semiconductor device of claim 1 wherein the continuous curves of the first side surfaces of the plurality of semiconductor chips are concave with respect to the X-Y plane.

6. The semiconductor device of claim 1, wherein one or more semiconductor chips from among the plurality of semiconductor chips further include opt-electrical conversion regions that extend inward from the first side surfaces of the one or more semiconductor chips in a direction parallel to the top surfaces of the one or more semiconductor chips.

7. The semiconductor device of claim 6, wherein the opt-electrical conversion regions of the one or more semiconductor chips extend radially from the continuous curves of the first side surfaces of the one or more semiconductor chips.

8. The semiconductor device of claim 6, further comprising:
optical shield layers on the bottom surfaces of the one or more semiconductor chips.

9. The semiconductor device of claim 6, further comprising:
first elements on the first side surfaces of the one or more semiconductor chips, each first element being a scintillator or a color filter.

10. A semiconductor module comprising:
a plurality of first semiconductor devices,
wherein each of the plurality of first semiconductor devices has the structure of the semiconductor device of claim 1, and the plurality of first semiconductor devices are arranged adjacent to each other such that the continuous curves of the first side surfaces of the plurality of first semiconductor devices form a substantially circular surface.

11. A semiconductor device comprising:
a stacked structure including a plurality of semiconductor chips stacked successively in a first direction that is parallel to a Z-axis, the plurality of semiconductor chips being electrically connected to each other through electrical contacts located in between adjacent pairs of semiconductor chips among the plurality of semiconductor chips,
each of the plurality of semiconductor chips including,
a top surface that is parallel to an X-Y plane defined by an X-axis and a Y-axis,
a bottom surface that is opposite the top surface and parallel to the X-Y plane, and
a plurality of side surfaces that are parallel to the Z-axis, the plurality of side surfaces including,
a first side surface that is curved with respect to the X-Y plane, and
second through fourth side surfaces, the stacked structure having a 4-sided footprint with respect to the X-Y plane, the 4-sided footprint being defined by the first through fourth side surfaces of each of the plurality of semiconductor chips, wherein one or more semiconductor chips from among the plurality of semiconductor chips further include opt-electrical conversion regions that extend inward from the curved first side surfaces of the one or more semiconductor chips in a direction parallel to the top surfaces of the one or more semiconductor chips.

12. A semiconductor module comprising:

a plurality of first semiconductor devices, wherein, each first semiconductor device, from among the plurality of first semiconductor device, comprises:
- a stacked structure including a plurality of semiconductor chips stacked successively in a first direction that is parallel to a Z-axis, the plurality of semiconductor chips being electrically connected to each other through electrical contacts located in between adjacent pairs of semiconductor chips among the plurality of semiconductor chips,
- each of the plurality of semiconductor chips including,
  - a top surface that is parallel to an X-Y plane defined by an X-axis and a Y-axis,
  - a bottom surface that is opposite the top surface and parallel to the X-Y plane, and
  - a plurality of side surfaces that are parallel to the Z-axis, the plurality of side surfaces including,
    - a first side surface that is curved with respect to the X-Y plane, and
    - second through fourth side surfaces,
- the stacked structure having a 4-sided footprint with respect to the X-Y plane,
- the 4-sided footprint being defined by the first through fourth side surfaces of each of the plurality of semiconductor chips, and wherein the plurality of first semiconductor devices are arranged adjacent to each other such that the curved first side surfaces of the plurality of first semiconductor devices form a substantially circular surface.

13. A semiconductor device comprising:

a stacked structure including a plurality of semiconductor chips stacked successively in a first direction that is parallel to a Z-axis, the plurality of semiconductor chips being electrically connected to each other through electrical contacts located in between adjacent pairs of semiconductor chips among the plurality of semiconductor chips, each of the plurality of semiconductor chips including,
- a top surface that is parallel to an X-Y plane defined by an X-axis and a Y-axis,
- a bottom surface that is opposite the top surface and parallel to the X-Y plane, and
- a plurality of side surfaces that are parallel to the Z-axis, the plurality of side surfaces including,
  - a first side surface that is curved with respect to the X-Y plane, and
  - second through fourth side surfaces, the stacked structure having a 4-sided footprint with respect to the X-Y plane, the 4-sided footprint being defined by the first through fourth side surfaces of each of the plurality of semiconductor chips, wherein the curved first side surfaces of the plurality of semiconductor chips are convex with respect to the X-Y plane.

* * * * *